United States Patent [19]

Konishi

[11] Patent Number: 4,499,387
[45] Date of Patent: Feb. 12, 1985

[54] INTEGRATED CIRCUIT FORMED ON A SEMICONDUCTOR SUBSTRATE WITH A VARIABLE CAPACITOR CIRCUIT

[75] Inventor: Satoshi Konishi, Tokyo, Japan

[73] Assignee: Tokyo Shibaura Denki Kabushiki Kaisha, Japan

[21] Appl. No.: 446,724

[22] Filed: Dec. 3, 1982

[30] Foreign Application Priority Data

Dec. 15, 1981 [JP] Japan ................. 56-201837
Jan. 18, 1982 [JP] Japan ................. 57-5680

[51] Int. Cl.³ .................. H03K 4/94; H03K 5/01
[52] U.S. Cl. .................. 307/443; 307/246; 307/451; 307/469; 307/585; 307/268; 307/591
[58] Field of Search ............. 307/443, 448, 451, 468, 307/469, 246, 574–576, 579, 581, 584, 585, 267, 268, 591, 594, 601, 603, 605, 263

[56] References Cited

U.S. PATENT DOCUMENTS

| | | | |
|---|---|---|---|
| 3,852,619 | 12/1974 | Carbrey | 307/268 |
| 3,872,321 | 3/1975 | Matsue | 307/448 |
| 3,944,848 | 3/1976 | Heeren | 307/448 |
| 4,130,766 | 12/1978 | Patel et al. | 307/578 X |
| 4,346,310 | 8/1982 | Carter | 307/578 X |
| 4,393,318 | 7/1983 | Takahashi et al. | 307/584 X |
| 4,424,456 | 1/1984 | Shiraki et al. | 307/246 X |
| 4,455,495 | 6/1984 | Masuhara et al. | 307/465 X |

OTHER PUBLICATIONS

Kokkonen et al., "Redundancy Techniques for Fast Static RAMs"; ISSCC 81/Wednesday, Feb. 18, 1981, IEEE International Solid-State Conference, pp. 80–81.

Primary Examiner—Stanley D. Miller
Assistant Examiner—David R. Hudspeth
Attorney, Agent, or Firm—Finnegan, Henderson, Farabow, Garrett & Dunner

[57] ABSTRACT

A MOS type semiconductor integrated circuit comprising a C-MOS inverter including P- and N-channel MOS transistors connected in series between $V_{DD}$ and $V_{SS}$ power supply terminals, the gates of the MOS transistors being supplied with an input signal; a variable capacitor connected between a node at which the transistors are interconnected and a reference voltage; and a voltage generator for producing an output voltage to the variable capacitor, the voltage generator being capable of irreversibly changing the level of the output voltage, thereby changing a capacitance of the variable capacitor.

23 Claims, 89 Drawing Figures

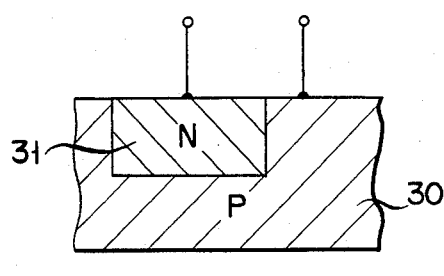
F I G. 24
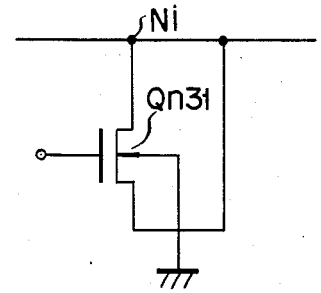
F I G. 25
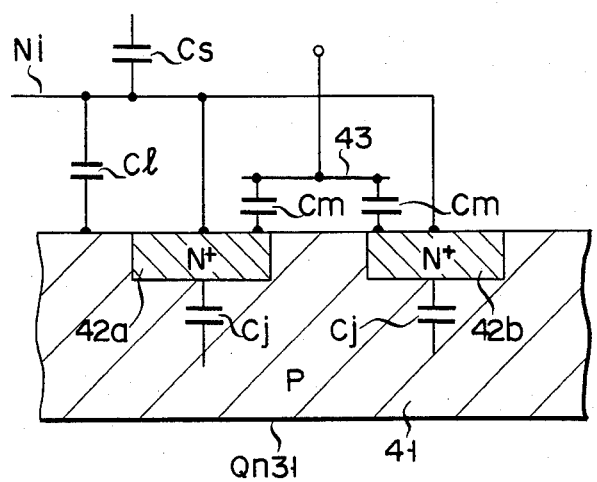
F I G. 26
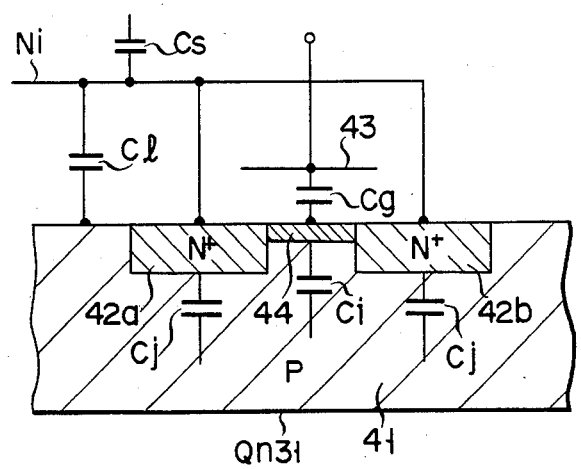
F I G. 27

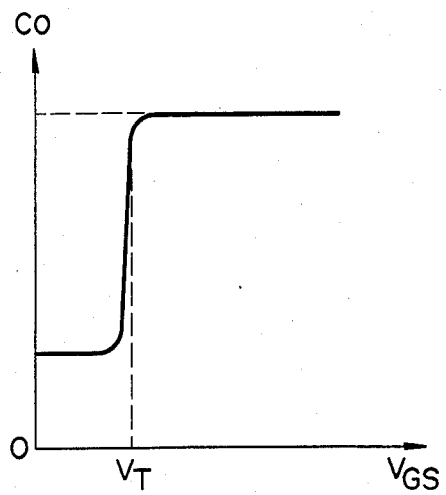
F I G. 28
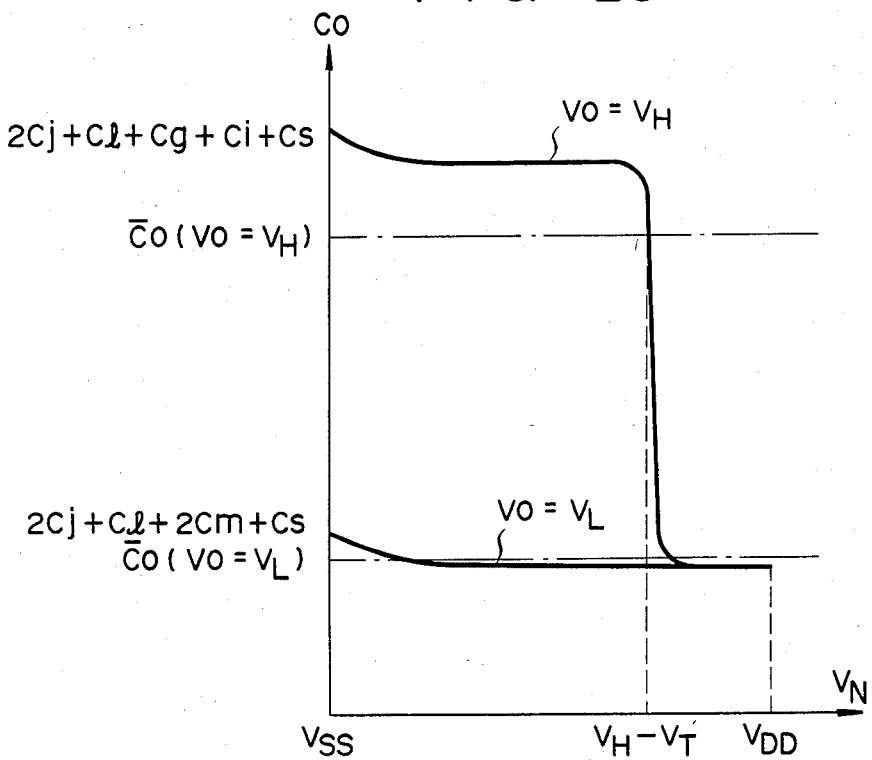
F I G. 29

F I G. 40
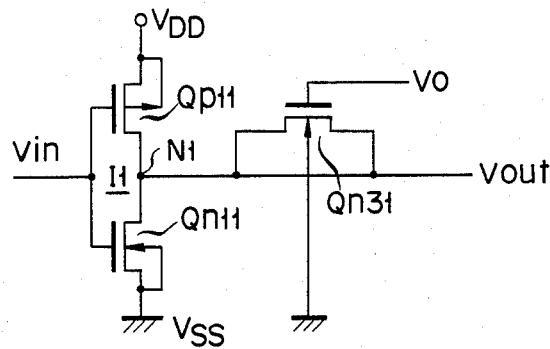
F I G. 41
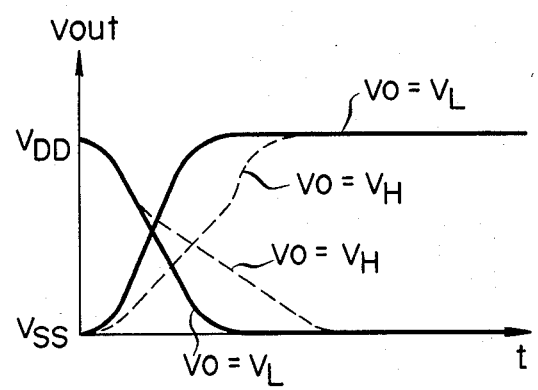
F I G. 42
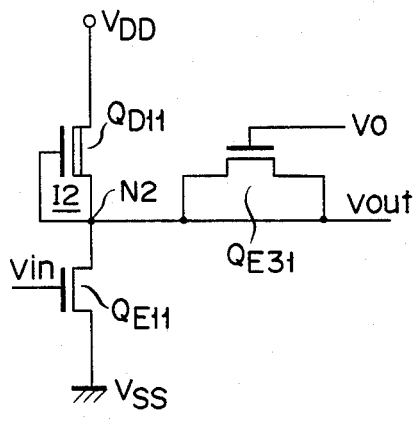
F I G. 43
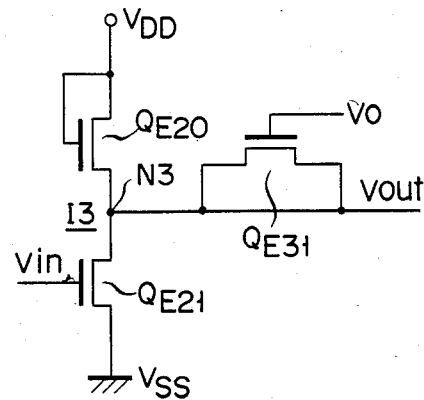

F I G. 52
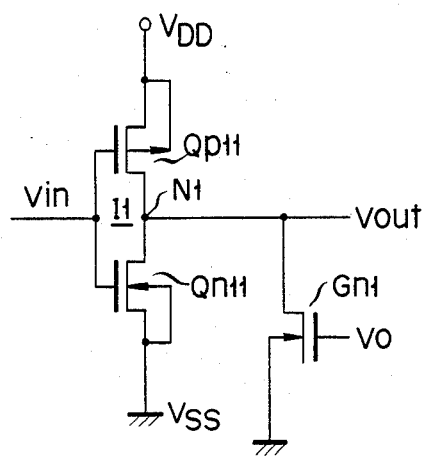
F I G. 53
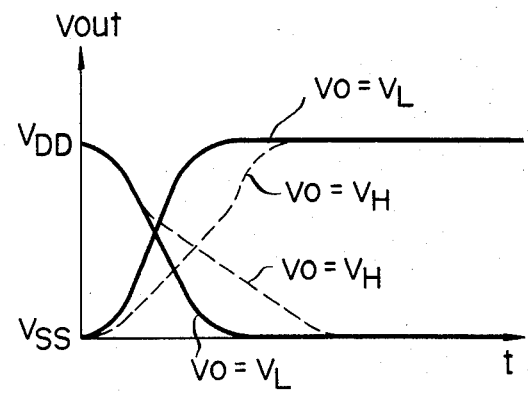
F I G. 54
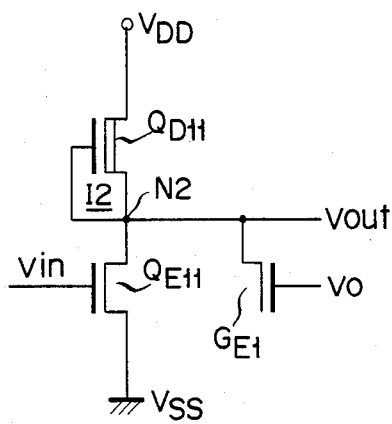
F I G. 55
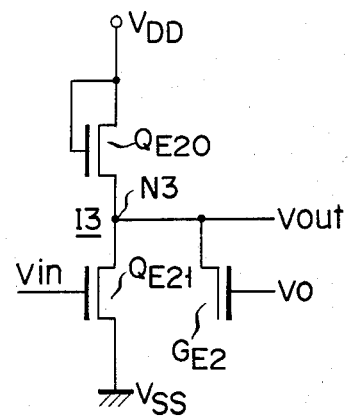

FIG. 60
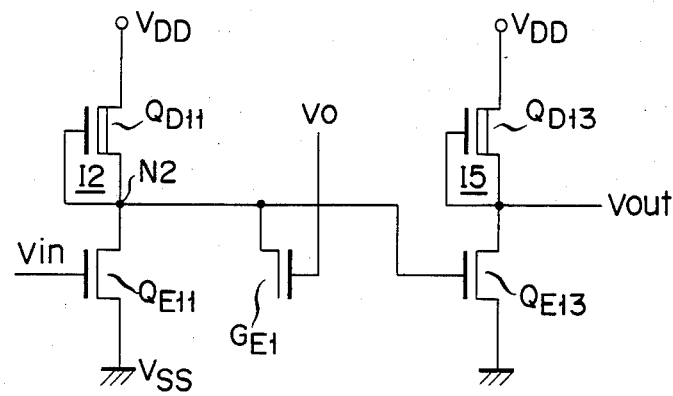
FIG. 61
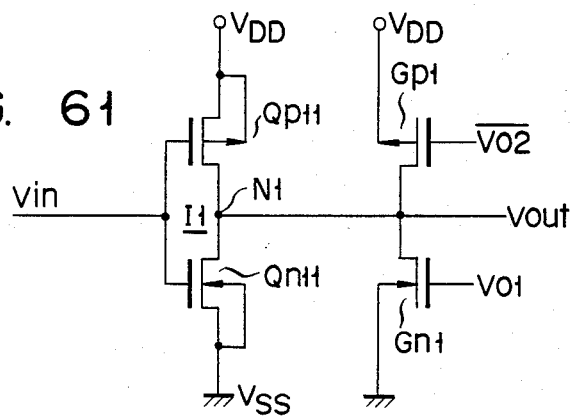
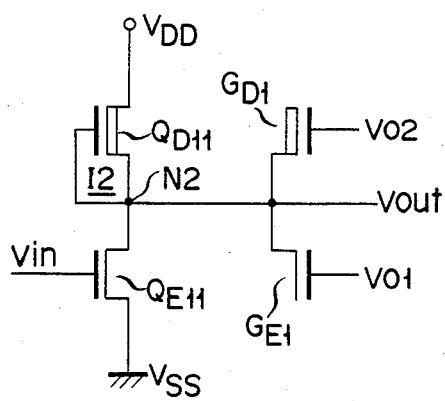
FIG. 62
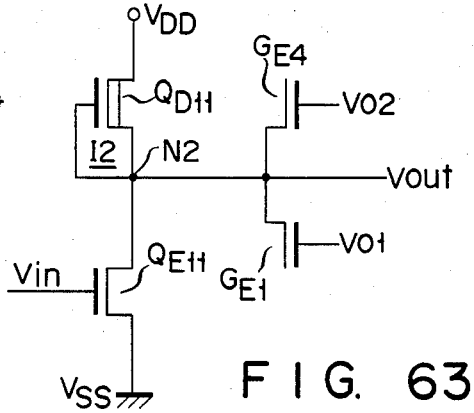
FIG. 63

F I G. 66
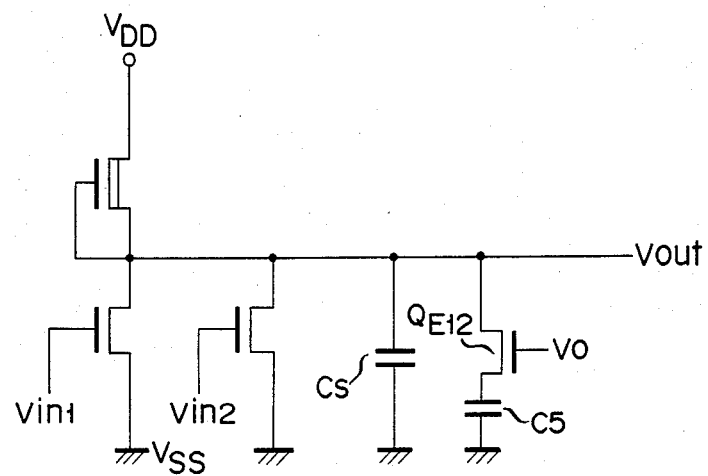
F I G. 67
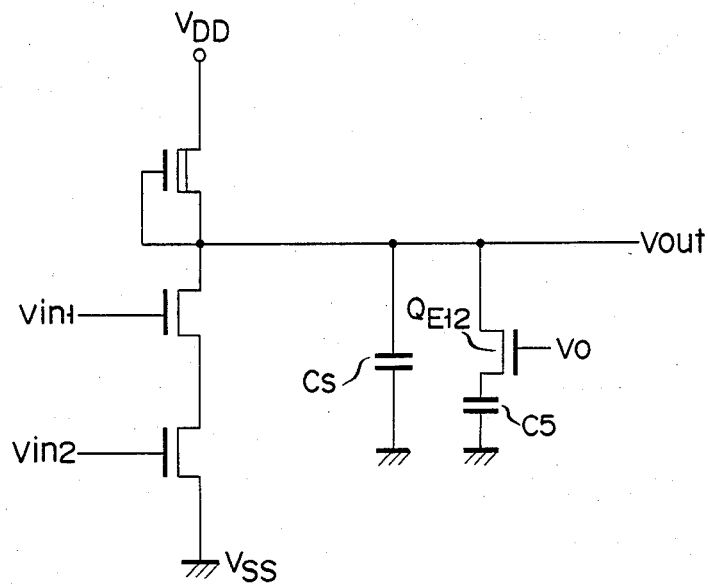

INTEGRATED CIRCUIT FORMED ON A SEMICONDUCTOR SUBSTRATE WITH A VARIABLE CAPACITOR CIRCUIT

BACKGROUND OF THE INVENTION

The present invention relates to a MOS type semiconductor integrated circuit requiring little margin for signal transmission time.

Signal transmission time in semiconductor integrated circuits composed of MOS (metal oxide semiconductor) type transistors is determined by transfer conductance "gm" of the MOS transistors which controls the voltage at nodes in the circuit and stray capacitance "C" of those nodes. Of these two determinants, "gm" can be accurately estimated on the basis of the electrical performance of the transistors. Accurate estimation of the capacitance "C", however, is difficult. Further, the capacitance "C" changes more than the conductance "gm" does when process parameters are changed in their manufacturing stage. This also makes it difficult to estimate, the precise capacitance values.

Difficult estimation of the stray capacitance "C" results in an inexact estimation of the signal transmission time. It is for this reason that the prior circuit of this type must be designed with a relatively large margin for signal transmission time. Simultaneously, however, there have been technical tendencies in this field, such as increasing integration density and shrinkage by scaling down, towards more complicated construction of the semiconductor circuit and increasing operating speed of the circuit. To satisfy these tendencies, large margins in the circuit operating time must be avoided. In particular, the overall operating speed of the integrated circuit is considerably limited when there is such a large margin in operating speed.

SUMMARY OF THE INVENTION

Accordingly, an object of the present invention is to provide a MOS type semiconductor integrated circuit requiring little margin for circuit operating time.

According to the invention, there is provided a semiconductor integrated circuit comprising:

a first terminal for receiving a first power supply voltage;

a second terminal for receiving a second power supply voltage;

a transistor circuit comprising a plurality of transistors connected in series between said first and second terminals, at least one of the transistors being supplied with an input signal at the gate thereof;

a variable capacitor circuit connected between a node at which two of said transistors are interconnected and a reference voltage; and a voltage generator for producing an output voltage signal to said variable capacitor circuit, the voltage generator being capable of irreversibly changing the level of the output voltage signal thereby changing a capacitance of said variable capacitor circuit.

BRIEF DESCRIPTION OF THE DRAWINGS

FIGS. 22 to 24 illustrate structures of capacitors assembled into the embodiments as mentioned above;

FIG. 25 is a circuit diagram of a variable capacitor circuit assembled into a semiconductor integrated circuit according to the present invention;

FIGS. 26 and 27 respectively show cross sectional views of the semiconductor integrated circuit of FIG. 25 in which equivalent circuits for different operation modes are depicted;

FIG. 28 is a graphical representation of a variation of a capacitance with respect to a gate-substrate voltage $V_{GS}$ of the variable capacitor circuit shown in FIG. 25;

FIG. 29 illustrates a variation of a capacitance with respect to a node voltage $V_N$ in the variable capacitor circuit shown in FIG. 25;

FIG. 40 is a circuit diagram of an embodiment of a C-MOS semiconductor integrated circuit according to the present invention;

FIG. 41 is a graphical representation of an input/output characteristic of the integrated circuit of FIG. 40;

FIGS. 42 to 46 are circuit diagrams of other embodiments of the integrated circuit incorporating a variable capacitor circuit composed of a MOS transistor;

FIG. 52 is a circuit diagram of a C-MOS integrated circuit incorporating a variable capacitor circuit composed of a MOS capacitor;

FIG. 53 is a graph illustrating input and output characteristics of the C-MOS semiconductor integrated circuit of FIG. 52;

FIGS. 54 to 58 are circuit diagrams of the integrated circuit incorporating a variable capacitor circuit composed of a MOS capacitor;

FIGS. 60 to 63 show circuit diagrams of other embodiments of the integrated circuit incorporating a variable capacitor circuit composed of a MOS transistor, respectively; and FIGS. 64 to 71 show circuit diagrams of other embodiments of the integrated circuit, respectively.

DETAILED DESCRIPTION OF THE PREFERRED EMBODIMENTS

Figure 1:
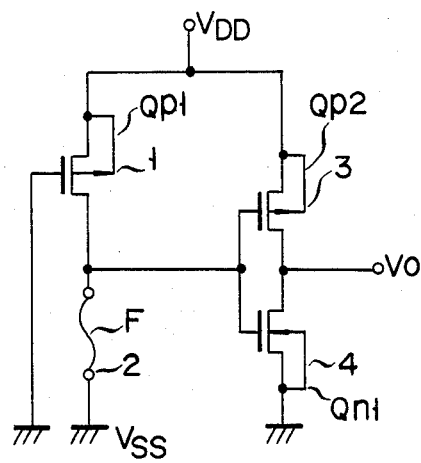
FIG. 1 a circuit diagram of a voltage generator incorporated into a C-MOS semiconductor integrated circuit according to the present invention.
Figure 2:
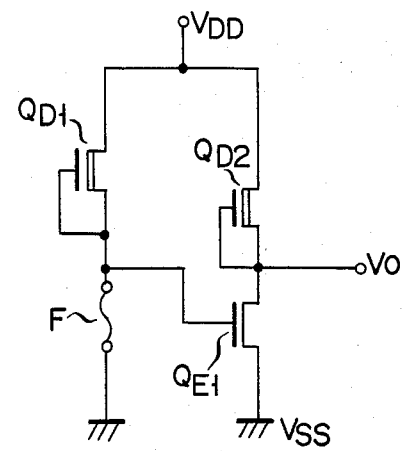
FIG. 2 is a circuit diagram of another voltage generator.

Reference is made to FIGS. 1 and 2 illustrating voltage generators incorporated into a MOS semiconductor integrated circuit according to the present invention. In the voltage generator, a P-channel MOS transistor $Q_{p1}$ and a fuse F composed of a polysilicon interconnection layer or a metal interconnection layer are arranged in series fashion between a power supply terminal to which a power supply voltage $V_{DD}$ with positive or high voltage is applied and a power supply terminal to which a power supply voltage $V_{SS}$ with negative or low voltage (ground level in the embodiment) is applied. The MOS transistor $Q_{p1}$ is connected at the source to the positive power supply voltage $V_{DD}$ and at the drain to the negative power supply voltage $V_{SS}$ via the fuse F. The gate of the MOS transistor $Q_{p1}$ is connected to the negative power supply voltage $V_{SS}$.

Two MOS transistors $Q_{p2}$ and $Q_{n1}$ are inserted in series between the power supply voltages $V_{DD}$ and $V_{SS}$. The transistor $Q_{p2}$ is of a P-channel type and the transistor $Q_{n1}$ is of an N-channel type. The source of the P-channel MOS transistor $Q_{p2}$ is connected to the power supply voltage $V_{DD}$. The source of the P-channel MOS transistor $Q_{p2}$ is connected to the positive power supply voltage $V_{DD}$. The source of the N-channel MOS transistor $Q_{n1}$ is connected to the negative power supply voltage $V_{SS}$. The MOS transistors $Q_{p2}$ and $Q_{n1}$ are interconnected at both drains and the interconnecting point (i.e. junction node) provides an output voltage Vo. The drain of the transistor $Q_{p1}$ is connected to both gates of the transistors $Q_{p2}$ and $Q_{n1}$. The transistors $Q_{p2}$ and $Q_{n1}$ constitute a C-MOS (Complementary MOS) inverter.

In this arrangement of the voltage generator, when the fuse F is not blown out, the drain voltage of the transistor $Q_{p1}$ is nearly $V_{SS}$, and the transistor $Q_{p2}$ is ON and the transistor $Q_{n1}$ is OFF. Thus the output voltage Vo becomes high voltage $V_H$ and is substantially equal to the positive power supply voltage $V_{DD}$. On the contrary, when the fuse F is blown out, the drain voltage of the transistor $Q_{p1}$ is nearly $V_{DD}$, and the transistor $Q_{p2}$ is OFF and the transistor $Q_{n1}$ is ON. Thus the output voltage Vo is low voltage $V_L$ and is substantially equal to the negative power supply voltage $V_{SS}$. The fuse F is melted by irradiation with laser beams or flowing a large current into the fuse. Once the fuse F is blown out, the current path between the drain of the transistor $Q_{p1}$ and the negative power supply voltage $V_{SS}$ is open and left as is. Under this condition, once the output voltage Vo is changed to low voltage $V_L$, it can not be returned to the original voltage, that is, to high voltage $V_H$. In other words, the change of voltage state is irreversible. Conversely, the change of voltage state low to high voltage is likewise irreversible when another C-MOS inverter is inserted between the output terminal for the output voltage Vo and the junction node between the transistors $Q_{p2}$ and $Q_{n1}$, the input of the inserted C-MOS inverter being connected to the junction node and the output to the output terminal. Therefore, either change of voltage state from high to low or vice versa may be irreversible.

A voltage generator shown in FIG. 2 is an E/D type voltage generator constructed by an enhancement type MOS transistor and two depletion type MOS transistors. The voltage generator has a series circuit of a depletion type MOS transistor $Q_{D1}$ and a fuse F between the power supply voltages $V_{DD}$ and $V_{SS}$. The depletion type MOS transistor $Q_{D1}$ is connected at the drain to the positive power supply voltage $V_{DD}$ and at the source to the negative power source $V_{SS}$ through the fuse F. The gate of the transistor $Q_{D1}$ is connected to the source thereof. A depletion type MOS transistor $Q_{D2}$ serving as a load transistor and an enhancement type MOS transistor $Q_{E1}$ are further connected in series between the power supply voltages $V_{DD}$ and $V_{SS}$. A junction node between MOS transistor $Q_{D1}$ and the fuse F is connected to the gate of the MOS transistor $Q_{E1}$. The gate of the transistor $Q_{D2}$ is further connected to the junction node between the transistors $Q_{D2}$ and $Q_{E1}$. The output voltage Vo is derived from the junction node. Also in this circuit, when the fuse F is intact, the gate voltage of the transistor $Q_{E1}$ is low voltage level and the transistor $Q_{E1}$ is OFF, and the output voltage Vo is high ($V_H$). Conversely, when the fuse F is blown out, the gate voltage of the transistor $Q_{E1}$ is at high voltage $V_{DD}$ and the transistor $Q_{E1}$ is ON. The output voltage Vo is thus low ($V_L$). As in the FIG. 1 circuit, after the fuse F is blown out to open the path from the source of the transistor $Q_{D1}$ to the power supply voltage $V_{SS}$, the FIG. 2 circuit can not return to its original state, i.e. the conductive state of the fuse F. Thus, once the output voltage Vo is changed from the high voltage $V_H$ to the low voltage $V_L$ by blowing out the fuse F, the changed low voltage state can not be returned to the high voltage state. The change of voltage state from high to low voltage is irreversible. Similarly, the change of voltage state from low to high voltage is also made irreversible when another E/D inverter is inserted between the output terminal for the output voltage Vo and the junction node between the transistors $Q_{D2}$ and $Q_{E1}$, where the input of the inserted E/D inverter is connected to the junction node and the output to the output terminal. Therefore, either change of voltage state from high to low voltage or vice versa may be rendered irreversible.

Figure 3:
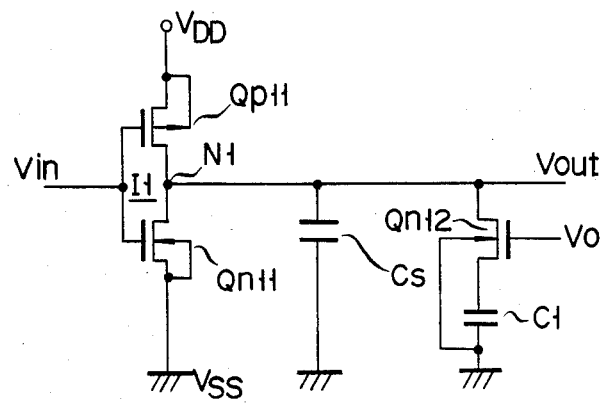
FIG. 3 illustrates a circuit arrangement when a MOS semiconductor integrated circuit according to the present invention is applied to a C-MOS inverter.

Turning now to FIG. 3, there is shown a circuit arrangement according to the present invention in which a MOS semiconductor integrated circuit is utilized as a C-MOS inverter.

Figure 4A:
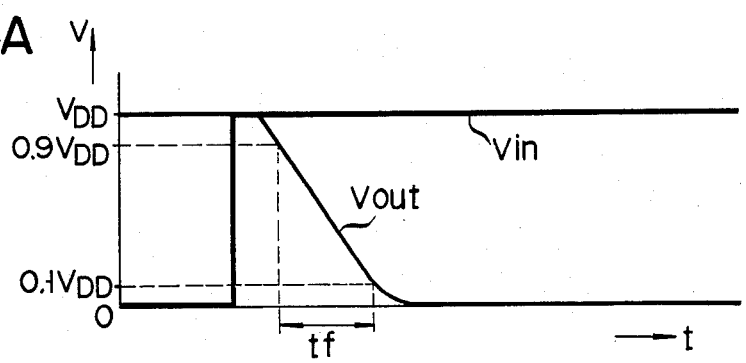
FIGS. 4A to 4D are graphs, each illustrating input or output characteristic of the C-MOS semiconductor integrated circuit shown in FIG. 3.
Figure 4B:
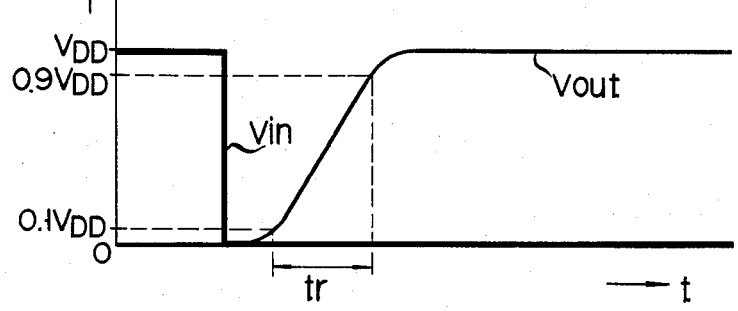
Figure 4C:
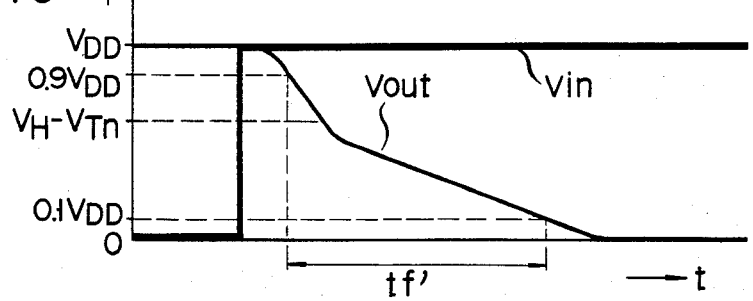
Figure 4D:
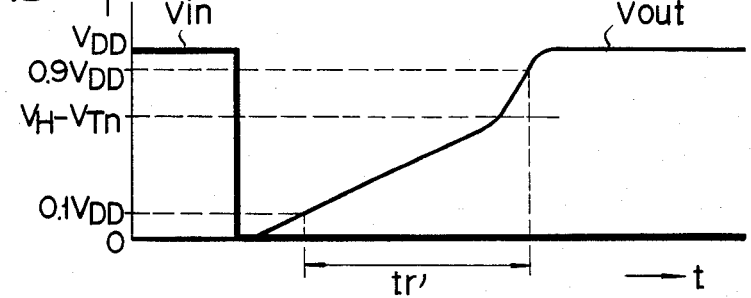
Figure 5A:
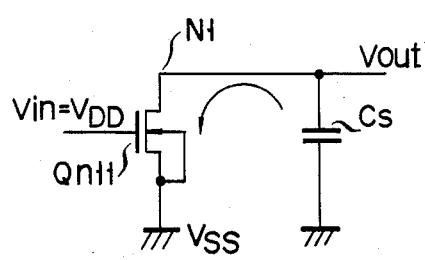
FIGS. 5A to 5D are equivalent circuits, each for different operation modes of the C-MOS semiconductor integrated circuit of FIG. 3.
Figure 5B:
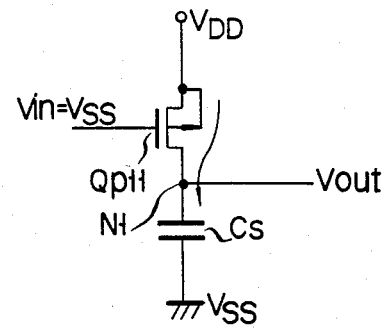
Figure 5C:
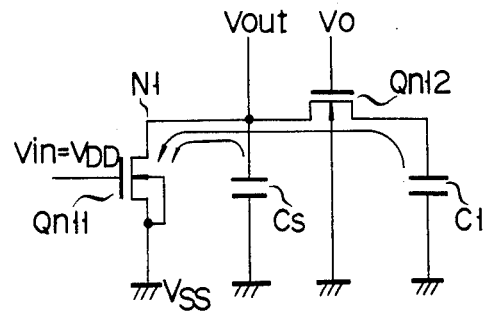
Figure 5D:
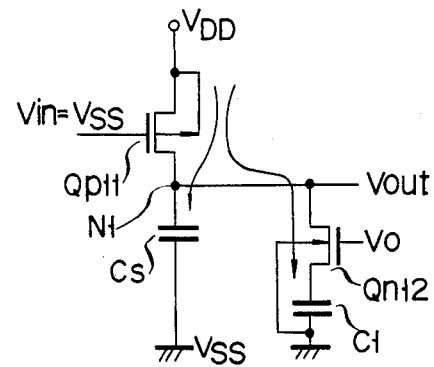

In the circuit shown in FIG. 3, P- and N-channel MOS transistors Qp11 and Qn11 make up a C-MOS inverter $I_1$. The source of the P-channel MOS transistor Qp11 is connected to the power supply voltage $V_{DD}$ and the drain to a node N1. The drain of the N-channel MOS transistor Qn11 is connected to the node N1 and the source to the power supply voltage $V_{SS}$. The transistors Qp11 and Qn11 are interconnected at the gates and the interconnecting point, i.e. junction node, is impressed with an input voltage Vin. The output node N1 of the C-MOS inverter $I_1$ thus arranged is connected to the drain of the N-channel MOS transistor Qn12. The source of the same transistor is connected through a capacitor element C1 to the power supply voltage $V_{SS}$. The gate of the transistor Qn12 is impressed with the output voltage Vo from the circuit as shown in FIG. 1 or 2. In the circuit as shown in FIG. 3, a series circuit composed of a capacitor C1 and a MOS transistor Qn12, with a gate input being the output voltage Vo from the voltage generator as shown in FIG. 1 or 2, is inserted between the node N1 and the power supply voltage $V_{SS}$. A capacitor Cs inserted between the node N1 and the power supply voltage $V_{SS}$ characterizes the stray capacitance parasitically associated with the output node N1. In the FIG. 3 circuit, when the voltage Vo is low ($V_L$), the MOS transistor Qn12 is OFF. Under this condition, when the level of the input voltage Vin to the C-MOS inverter $I_1$ is $V_{SS}$ voltage to $V_{DD}$ voltage (in this embodiment, $V_{SS}=0(V)$), as shown in FIG. 4A, the FIG. 3 circuit may equivalently be depicted as shown in FIG. 5A. The falling state of the output voltage Vout at node N1 corresponds to a discharging state of the capacitor Cs when it is discharged through the MOS transistor Qn11, as shown in FIG. 4A. When the level of the input voltage Vin changes from $V_{DD}$ voltage to $V_{SS}$ voltage, as shown in FIG. 4B, the equivalent circuit of the FIG. 3 circuit is as shown in FIG. 5B. As shown, a rising state of the output voltage Vout at the node N1 corresponds to a charging state of the capacitor Cs through the MOS transistor Qp1. Arrows in FIGS. 5A and 5B indicate the flows of discharging and charging currents, respectively. Incidentally, in FIGS. 4A and 4B, $t_f$ and $t_r$ are respectively rise and fall times which are defined by the time duration between 10% and 90% of the power supply voltage $V_{DD}$ to the power supply voltage $V_{SS}$. When the output voltage Vo is high ($V_H$), the transistor Qn12 is ON. In the ON state, between the node N1 and the power supply voltage $V_{SS}$, the capacitor C1 is added to the stray capacitor Cs via the transistor Qn12. The result is an increase in effective capacitance of the node N1. When the input voltage Vin is changed from $V_{SS}$ to $V_{DD}$, the falling state is as shown in FIG. 4C and the equivalent circuit of the FIG. 3 circuit is as shown in FIG. 5C. The falling state of the output voltage Vout at node N1 changes as indicated by a waveform shown in FIG. 4C, because discharge currents from the capacitors Cs and C1 additively flow at node N1. Next, when the input voltage Vin changes from $V_{DD}$ to $V_{SS}$, as shown in FIG. 4D, the FIG. 3 circuit may equivalently be depicted as shown in FIG. 5D. The rising state of the voltage Vout at node N1 on takes a time-dependence as shown in FIG. 4D, because the charge currents to the capacitors Cs and C1 flow additively together. Arrows in FIGS. 5C and 5D indicate the flows of the discharge and charge currents, respectively.

The rising time $t'_r$ and falling time $t'_f$ in the voltage changing states shown in FIGS. 4C and 4D are larger than those in the potential changing states in FIGS. 4A and 4B, respectively. The reason for this is that the output voltage Vo of the voltage generator is changed from low to high and hence the effective electrical capacitance at the node is changed. Exact definitions of the relationships of the rising time $t_r$ and $t'_r$ and the falling time $t_f$ and $t'_f$ with respect to the circuit parameter are difficult to obtain, but approximate relationships may be given as follows, with the assumption that the capacitor C1 has a linear capacitance and also includes the gate capacitance of the transistor Qn12, and $\beta n11 << \beta n12$, $\beta p11 << \beta n12$, $Cs/\beta n11 >> C1/\beta n12$, $Cs/\beta p11 >> C1/\beta n11$ and $V_H = V_{DD}$, $$t'_f \simeq \left( \frac{Cs + Cl}{Cs} - \frac{\Delta t}{t_r} \right) t_f \tag{1}$$

$$t'_r \simeq \frac{Cs + Cl}{Cs} t_r - \Delta t, \tag{2}$$

where $\beta p11$, $\beta n11$ and $\beta n12$ are $\beta$ (i.e. gain coefficient of transconductance) of the MOS transistors Qp11, Qn11 and Qn12, respectively, and $\Delta t$ is expressed by $$\Delta t = \tag{3}$$

$$\frac{Cs + Cl}{\beta n11(V_{DD} - V_T)} \ln \left( \frac{2(V_{DD} - V_T) - V_T}{2V_T - 0.1V_{DD}} \cdot \frac{0.1V_{DD}}{V_T} \right).$$

Figure 6:
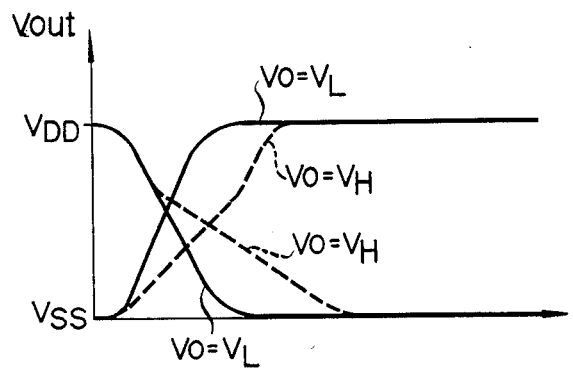
FIG. 6 is a graph illustrating input and output characteristics of the C-MOS semiconductor integrated circuit of FIG. 3.

In the equation (3), $V_T$ is a threshold voltage of each of the transistors Qn1 and Qn2. The equations (1) and (2) show that an effective capacitance at node N1 when the voltage Vo is high ($V_H$), is approximately, $(Cs+C1)/Cs$ times that when it is low ($V_L$). Thus the rate of change of the output voltage Vout of the node N1 at $Vo=V_H$ is slower than that at $V_o=V_L$ as shown in FIG. 6. In other words, the former needs a longer time than the latter until the voltage reaches a given level. This indicates that the operating speed of the C-MOS inverter $I_1$ can be adjusted by changing the voltage of Vo. Accordingly, the electrical characteristics of the C-MOS inverter $I_1$ can be changed by changing the voltage of Vo.

Other circuit arrangements when a MOS type semiconductor integrated circuit according to the present invention is applied to the C-MOS inverter $I_1$ are shown in FIGS. 7 to 15.

Figure 7:
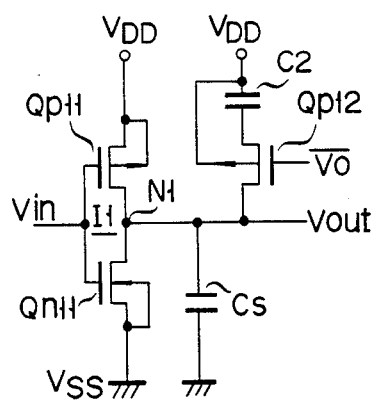
FIGS. 7 to 10 are respectively circuit diagrams of other embodiments of a C-MOS semiconductor integrated circuit according to the present invention.

The FIG. 7 embodiment has a series circuit composed of a capacitor C2 and a P-channel MOS transistor Qp12, which is laid between the output node N1 and the power supply voltage $V_{DD}$, while the FIG. 3 embodiment has a series circuit composed of the transistor Qn12 and the capacitor C1 and which is laid between the node N1 and the power supply voltage $V_{SS}$. The inverted voltage $\overline{Vo}$ is applied to the gate of the transistor Qp12.

In the FIG. 7 circuit, when the voltage $\overline{Vo}$ is high ($V_H$), the transistor Qp12 is OFF. At this time, its equivalent circuit is as shown in FIG. 5A or 5B. The equivalent circuit shows that when the voltage $\overline{Vo}$ is high ($V_H$), the capacitance Cs alone is charged or discharged. Conversely, when the voltage $\overline{Vo}$ is low ($V_L$), the transistor Qp12 is ON and the node N1 is coupled with the capacitor C2 via the MOS transistor Q12, in addition to the capacitor Cs. Both the capacitors are also grounded. When the output voltage Vout at node N1 falls, the capacitor Cs is discharged and the capacitor C2 is charged. On the other hand, when the voltage Vout rises, the capacitor Cs is charged and the capacitor C2 is discharged. In this embodiment, as in the FIG. 3 embodiment, when the output voltage Vo is high ($V_H$) and low ($V_L$), the effective capacitance at node N1 differs. The changing time of the voltage Vout under $\overline{Vo}=V_L$ is larger than that under $\overline{Vo}=V_H$.

Figure 8:
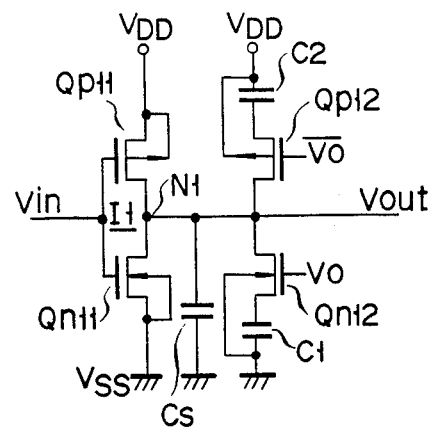

The FIG. 8 embodiment results from combining the FIGS. 3 and 7 embodiments. As shown, a series circuit composed of the capacitor C1 and the N-channel MOS transistor Qn12 with the gate input of Vo is inserted between the output node N1 and the power supply voltage $V_{SS}$. Another series circuit composed of the capacitor C2 and the P-channel MOS transistor Qp12 with a gate input of $\overline{Vo}$ is inserted between the node N1 and the power supply voltage $V_{DD}$.

Figure 9:
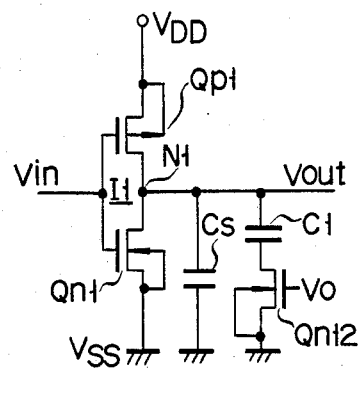

The FIG. 9 circuit is arranged similarly as in the FIG. 3 embodiment where the capacitor C1 and the MOS transistor Q12 are interchanged between the node N1 and the power supply voltage $V_{SS}$. This embodiment also attains effects similar to those of the FIG. 3 embodiment.

Figure 10:
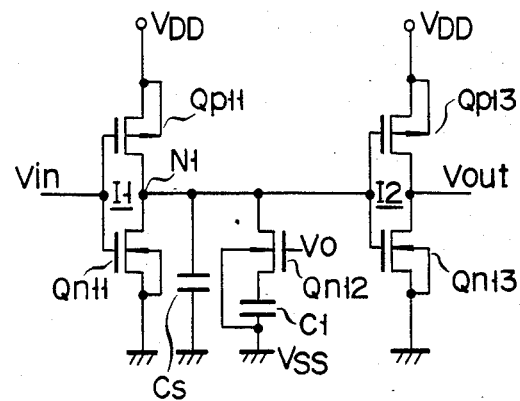
Figure 11A:
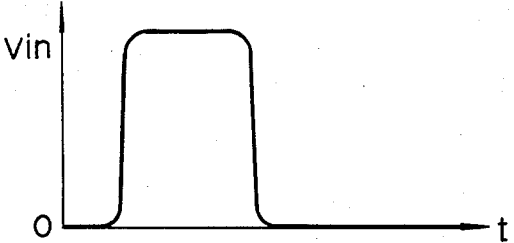
FIGS. 11A and 11B respectively are graphical representations of input and output characteristics of the integrated circuit of FIG. 10.
Figure 11B:
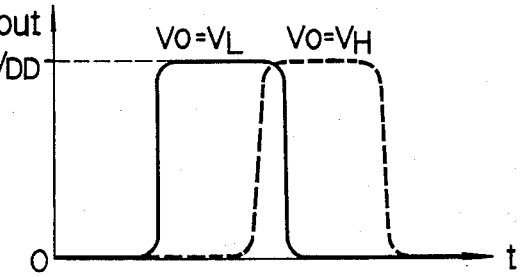

The FIG. 10 embodiment, serving as a delay circuit, is equivalent to the FIG. 3 embodiment additionally having a C-MOS inverter I2. As shown, the inverter I2, comprised of a P-channel MOS transistor Qp13 and an N-channel MOS transistor Qn13 coupled at their gates with the node N1. In more particular, the input terminal comprising the gates of these transistors is routed to the node N1. The output terminal of the inverter I2 as the conjunction of these transistors provides an output voltage Vout. When receiving a rectangular input voltage Vin as shown in FIG. 11A, the delay circuit of FIG. 10 exhibits different delay characteristics for $Vo=V_H$ and $Vo=V_L$, as shown in FIG. 11B. The delay time at $Vo=V_H$ is longer than that at $Vo=V_L$.

Figure 12:
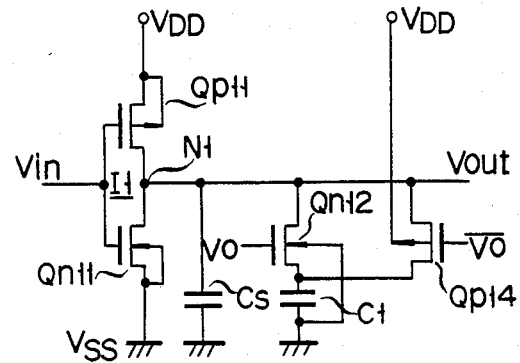
FIGS. 12, 13 and 14A are circuit diagrams of other embodiments of a C-MOS semiconductor integrated circuit according to the present invention.

The FIG. 12 embodiment circuit is equivalent to the FIG. 3 circuit modified such that a P-channel MOS transistor Qp14 with a gate input of $\overline{Vo}$ is coupled in parallel with an N-channel MOS transistor Qn12. A distinctive characteristic of the FIG. 12 embodiment is that a plurality of MOS transistors are parallel connected to a single capacitor C1. With such a construction, the capacitor C1 is charged up to the power supply voltage $V_{DD}$. Therefore, the effective capacitance at the output node N1 during a transient time is larger than that as in FIG. 3 circuit.

Figure 13:
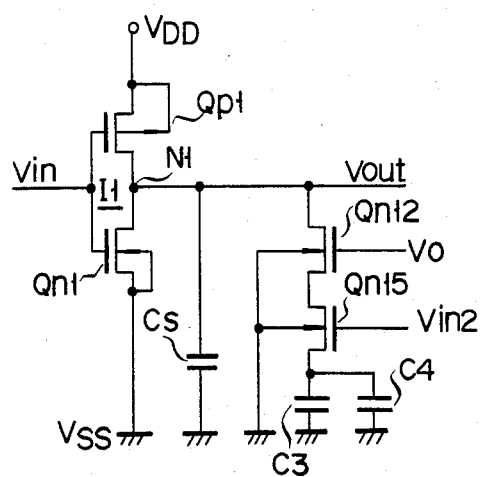

The FIG. 13 embodiment has a series circuit composed of an N-channel MOS transistor Qn12 with a gate voltage of Vo as the input voltage, an N-channel MOS transistor Qn15 with a gate input of Vin2 as the input voltage, and two capacitors C3 and C4 coupled in parallel. This series circuit is interposed between the output node N1 of the inverter I1 and the power supply voltage $V_{SS}$. The parallel capacitor arrangement may be composed of more than two capacitors. The FIG. 13 embodiment operates as an inverter with a variable delay time according to the input voltage Vin2 when the potential Vo is set to a proper value.

Figure 14A:
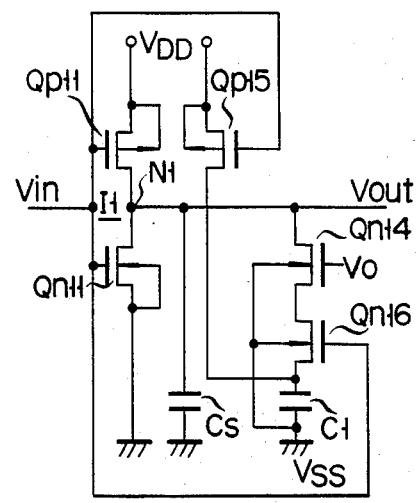
Figure 14B:
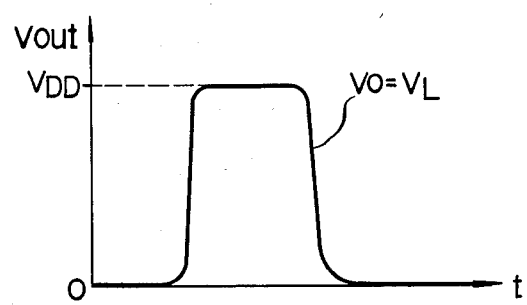
FIGS. 14B and 14C are graphical representations of the output characteristic of the integrated circuit shown in FIG. 14.

Another C-MOS inverter of the type as mentioned above is illustrated in FIG. 14A and its characteristics shown in FIG. 14B. This embodiment also has a series circuit including an N-channel MOS transistor Qn14 with the voltage Vo for its gate input, another N-channel MOS transistor Qn16 with the input voltage for its gate input, and a capacitor C1. This series circuit is inserted between the output node N1 and the power supply voltage $V_{SS}$. The present embodiment further includes a P-channel MOS transistor Qp15 with the input voltage Vin for the gate input. The transistor Qp15 is connected between the power supply voltage $V_{DD}$ and the conjunction node between the MOS transistor Qn16 and the capacitor C1.

Figure 14C:
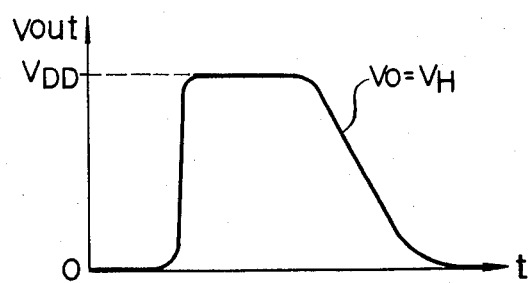

In the present embodiment, under $Vo=V_H$, the charging operation to the capacitor C1 when the voltage Vout rises is performed through two current paths from the power supply voltage $V_{DD}$: one composed of the transistor Qp11 and the other composed of the transistor Qp15. Therefore, the output voltage Vout when $Vo=V_H$, less sharply falls than when $Vo=V_L$, as shown in FIG. 14B. When the output voltage Vout falls, the capacitor C1 discharges through the current path including the MOS transistors Qn11, Qn14 and Qn16. The fall time of the output voltage Vout at $Vo=V_H$ is larger than that at $Vo=V_L$, as shown in FIG. 14C. FIGS. 14B and 14C respectively show the fall characteristic curves at $Vo=V_L$ and $Vo=V_H$.

Figure 15A:
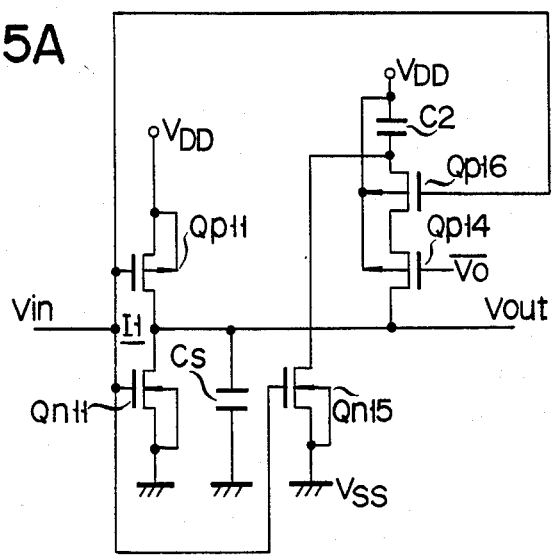
FIG. 15A is a circuit diagram of another embodiment of a C-MOS semiconductor integrated circuit according to the present invention.

An arrangement in which a delay in the rise time of the voltage Vout is adjusted by the inversed voltage $\overline{Vo}$, is illustrated in FIG. 15A. This arrangement has also a series circuit comprising a P-channel MOS transistor Qp14 with the voltage $\overline{Vo}$ for the gate input, a P-channel MOS transistor Qp16 with the input voltage Vin for the gate input, and a capacitor C2. This series circuit is inserted between the node N1 of the C-MOS inverter I1 and the power supply voltage $V_{DD}$. Further, an N-channel MOS transistor Qn15 receiving the input voltage Vin at the gate is connected between the power supply voltage $V_{SS}$ and a junction node between the transistor Qp16 and the capacitor C2.

Figure 15B:
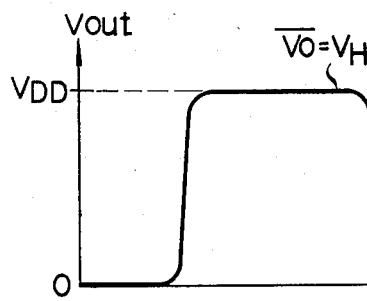
FIGS. 15B and 15C are graphical representations of output characteristic of the integrated circuit of FIG. 15A.
Figure 15C:
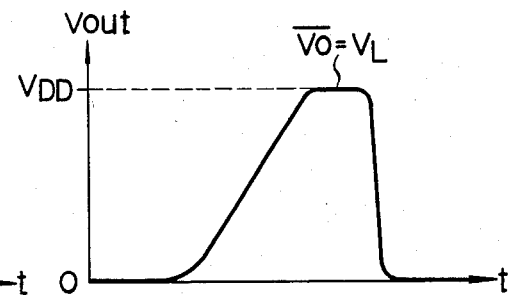

In the present embodiment, when $\overline{Vo}=V_L$, the discharge from the capacitor is done not only through the current paths of the MOS transistors Qn11 and Qn14 but also through the current path of the transistor Qn15. At the fall of the output voltage Vout, the time delay when $\overline{Vo}=V_L$ is smaller than when $\overline{Vo}=V_H$. The charge to the capacitor C2 at the rise of the voltage Vout is done only through the current path including the transistor Qp11. In this case, the time delay is larger than when $\overline{Vo}=V_H$ (FIG. 15B). This rise characteristic is illustrated in FIG. 15C.

Turning now to FIGS. 16 to 20, there are shown circuit arrangements when a MOS semiconductor integrated circuit according to the present invention is applied to an E/D inverter composed of a depletion type MOS transistor and an enhancement type MOS transistor.

Figure 16:
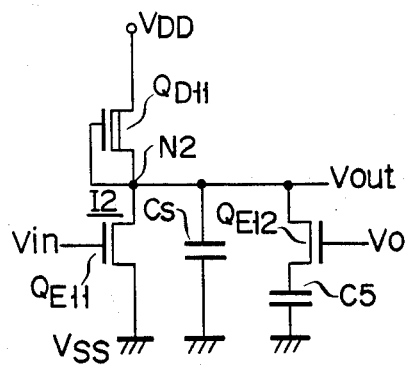
FIGS. 16 to 21 are circuit diagrams of other embodiments of a semiconductor integrated circuit according to the present invention.

In FIG. 16, the drain of a depletion type (simply referred to as a D type) MOS transistor $Q_{D11}$ is connected to the power supply voltage $V_{DD}$ and its source and gate to a node N2. The drain of an enhancement type MOS transistor $Q_{E11}$ is connected to the node N2 and its source to the power supply voltage $V_{SS}$. The input voltage is applied to the gate of the MOS transistor $Q_{E11}$. Connected between the node N2 and the power supply voltage $V_{SS}$ is a series circuit made up of a capacitor C5 and an E type MOS transistor $Q_{E1}$ receiving the voltage Vo at the gate. Incidentaly, a stray capacitor Cs interposed between the node N2 and the power supply voltage $V_{SS}$ is equivalent to a capacitor parasitically attached to the node N2, as in the case of C-MOS inverters as mentioned above.

Also in the FIG. 16 embodiment, the change time of the output voltage Vout when $Vo=V_H$ is larger than when $Vo=V_L$, similar to the circuit of FIG. 3.

Figure 17:
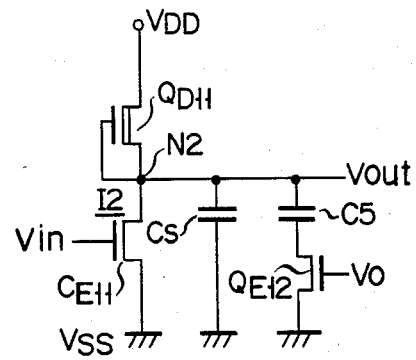

The FIG. 17 embodiment is equivalent to the FIG. 16 embodiment, which is modified such that the capacitor C5 and the MOS transistor $Q_{E12}$ are interchanged with each other between the node N2 and the power supply voltage $V_{SS}$. The present embodiment can also attain the effects equivalent to those in the FIG. 16 circuit.

Figure 18:
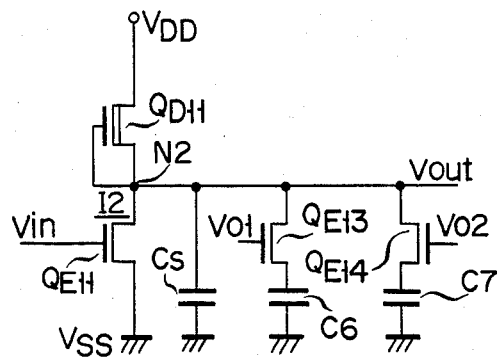

An embodiment of the integrated circuit shown in FIG. 18 employs two series circuits each including a capacitor and a MOS transistor, which are inserted in parallel between the output node N2 of the E/D inverter I2 and the power supply voltage $V_{SS}$. One of the two includes an E type MOS transistor $Q_{E13}$ with a gate input of Vo1 and a capacitor C6, and the other includes an E type MOS transistor $Q_{E14}$ with a gate input of Vo2 and a capacitor C7. It is noted here that two types of the voltages Vo1 and Vo2 are used for the control the ON or OFF state of the transistors $Q_{E13}$ and $Q_{E14}$, respectively. In operation, when either Vo1 or Vo2 is $V_H$, the effective capacitance at the node N2 increases by capacitance of the capacitor C6 or the capacitor C7. When Vo1 and Vo2 are both VH, the effective capacitance at the node N2 increases by the sum of the capacitances of the capacitor C6 and the capacitor C7. Provision of three or more series circuits each composed of the capacitor and the MOS transistor is of course involved in the spirit of the invention.

Figure 19:
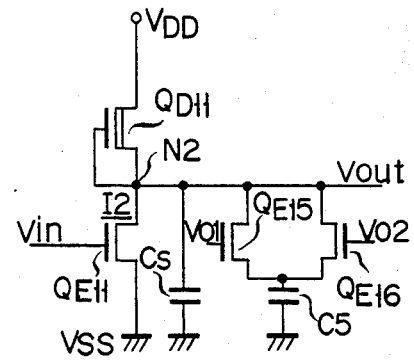

An embodiment of the integrated circuit shown in FIG. 19 employs two E type MOS transistors $Q_{E15}$ and $Q_{E16}$ with different threshold voltages, which are coupled in parallel, in place of the MOS transistors $Q_{E13}$ and $Q_{E14}$ in the FIG. 18 embodiment. A capacitor C5 is further inserted between a conjunction of the sources of both the transistors and the power supply voltage $V_{SS}$. When either the transistor $Q_{E15}$ or $Q_{E16}$ is turned on, the output node N2 is connected to the capacitor C5. The transistors $Q_{E15}$ and $Q_{E16}$ constitute an OR gate. When either voltage Vo1 or Vo2 is applied to the OR gate, the effective capacitance increases and the charge and discharge periods of time become larger. If the transistors $Q_{E15}$ and $Q_{E16}$ are connected in series with each other, then the transistors $Q_{E15}$ and $Q_{E16}$ constitute an AND gate. When both the voltages Vo1 and Vo2 are applied to the AND gate, the effective capacitance increases and the charge and discharge periods of time become larger.

Figure 20:
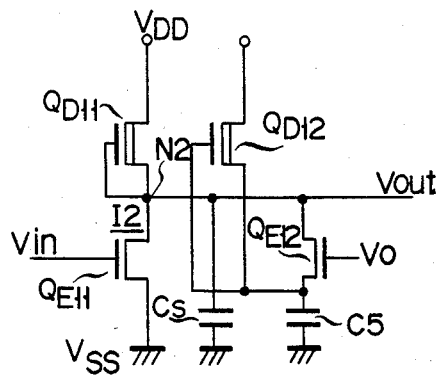

A FIG. 20 embodiment is so arranged that the charging path to the capacitor C5 includes a path passing through the D type MOS transistor $Q_{D12}$, in addition to the paths of the MOS transistors $Q_{D11}$ and $Q_{E12}$. As shown, a series circuit composed of the E type MOS transistor $Q_{E12}$ having the voltage Vo at the gate input and a capacitor C5 is inserted between the output node N2 of the E/D inverter I2 and the power supply voltage $V_{SS}$ through the transistor $Q_{D12}$. Further, a D type MOS transistor $Q_{D12}$ is inserted between the power supply voltage $V_{DD}$ and a junction node of the transistor $Q_{E12}$ and the capacitor C5. The gate of the transistor $Q_{D12}$ is connected to the same junction node. As for the signal transfer characteristic of the circuit, a delay at the time of the rise of the output voltage Vout, when $Vo=V_H$, is less than when $Vo=V_L$ because a charging current for the node N2 flows through not only the MOS transistor $Q_{D11}$ but also the MOS transistors $Q_{D12}$ and $Q_{E12}$. The discharge from the capacitor C5 at the time of the fall of the voltage Vout is performed through the current path passing through the MOS transistors $Q_{E11}$ and $Q_{E12}$. Accordingly, the fall time when $Vo=V_H$ is greater than that when $Vo=V_L$.

Figure 21:
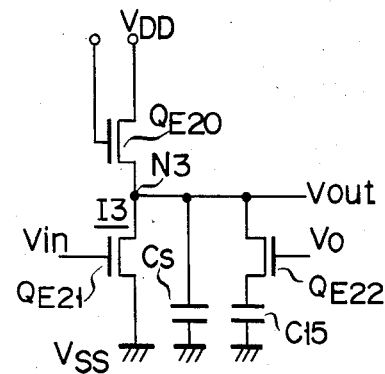

FIG. 21 shows a circuit arrangement when the integrated circuit according to the present invention is applied to an E/E inverter composed of only enhancement type MOS transistors. As shown, the drain and gate of an E type MOS transistor $Q_{E20}$ are connected to the power supply voltage $V_{DD}$ and its source is connected to an output node N3. The drain of another E type MOS transistor $Q_{E21}$ is connected to the node N3 and its source to the power supply voltage $V_{SS}$. These transistors thus arranged make up an E/E inverter I3. The gate of the transistor $Q_{E21}$ serves as an input applied with the input voltage Vin. The node N3 and the power supply voltage $V_{SS}$ have a series circuit therebetween, which includes a capacitor C15 and an E type MOS transistor $Q_{E22}$ with a gate input of the voltage Vo. Also in the present embodiment, the change time of the output voltage Vout, when $Vo=V_H$, is larger than that when $Vo=V_L$.

Figure 22:
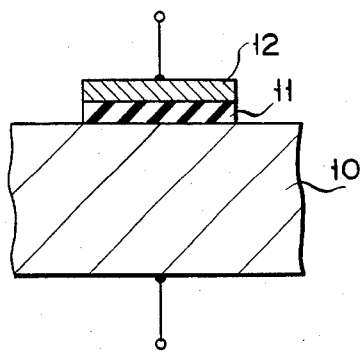

Turning to FIGS. 22 and 24, there are shown cross sections of structures of the capacitors C1 to C5 and C15. FIG. 22 illustrates the structure of a MOS capacitor. As shown, a gate metal layer 12 for an electrode made of polysilicon, for example, is laid over a gate insulation film 11 of $SiO_2$, for example, formed over a semiconductor substrate 10. The overlapping portion of the metal layer 12 with the substrate 10 has a capacitance.

Figure 23:
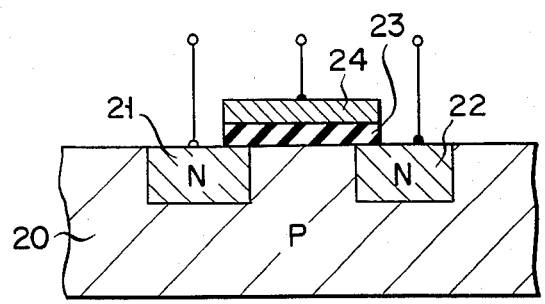

FIG. 23 shows another structure of the MOS capacitor. As shown two diffusion layers 21 and 22 are embedded in a semiconductor substrate 20 of the P conductivity type. A gate metal layer 24 for an electrode of polysilicon, for example, is positioned above a channel region between the two diffusion layers 21 and 22 of N conductivity type, while a gate insulation film 23 of $SiO_2$, for example, is interposed between the layer 24 and the channel region. With this structure, the capacitance, when no channel is formed, is present at the overlapping areas of the diffusion layers 21 and 22 with the metal layer 24. When the channel is formed, an additional capacitance is present at the overlapping area of the metal layer 24 with the channel formed.

FIG. 24 shows a PN junction capacitor formed between a semiconductor substrate 30 of P conductivity type and an impurity diffusion region 31 of N conductivity type formed in the substrate 30. In FIGS. 23 and 24, a P well region formed in the N type semiconductor substrate may be substituted for the P type semiconductor substrates 20 and 30, respectively. It is evident that other suitable types of capacitors than the above types may be used in the integrated circuit according to the present invention.

All the embodiments as mentioned above basically employ, as a variable capacitor circuit, the series combination of the MOS transistor and the capacitor provided between the power supply voltage and the output node of the MOS transistor circuit. Alternatively, a circuit arrangement as shown in FIG. 25 may be used as the variable capacitor circuit. In FIG. 25, a MOS transistor Qn31 is connected at the source and drain to the node of the transistor circuit, and receives at the gate the voltage Vo from the voltage generator.

FIG. 25 shows a circuit diagram of a variable capacitance circuit in which the drain and source of a MOS transistor Qn31 of the N-channel enhancement type are connected to a proper circuit node Ni. In the FIG. 25 circuit, when a gate-source voltage Vgs is smaller than a threshold voltage $V_T$ of the MOS transistor Qn31, a capacitance Co at node Ni is the sum of various capacitors shown in FIG. 26 illustrating a cross sectional structure of the MOS transistor Qn31. In the structure of the MOS transistor Qn31 shown in FIG. 26, a pair of N+ type regions 42a and 42b serving as source and drain regions are formed in the surface regions of a P type semiconductor substrate 41, while spaced from each other at a given distance. A gate 43 is formed on the substrate 41 between the N+ regions 42a and 42b. When Vgs<$V_T$, junction capacitances Cj are present between both the regions 42a and 42b and the substrate 41. The interconnection wire for connecting the N+ regions 42a and 42b is attended by a capacitance Cl. A lateral overlapping portion of the each pair of the N+ region 42a or 42b with the gate 43 is accompanied by a capacitance Cm. A capacitance Cm is associated with the overall structure of the transistor Qn31. In the case, the capacitance Co associated with the node Ni is given by the following equation.

$$Co = 2Cj + Cl + 2Cm + Cs \qquad \ldots (4),$$

where Cs implies the stray capacitance.

Assuming that a lateral overlapping distance of the N+ regions 42a and 42b with the gate 43 is ΔL, a width of the gate electrode 43 is W, a thickness of the gate insulation film is $t_{ox}$, and a dielectric constant of the gate insulation film is $\epsilon_{ox}$, the capacitance Cm may quantitatively be given by $$Cm = \epsilon_{ox} \frac{\Delta L \cdot W}{t_{ox}} \qquad (5)$$

In the equation (5), ΔL×W indicates an area of the overlapping portion of the N+ region 42a or 42b with the gate electrode 43.

In the FIG. 25 circuit, when the source voltage of the MOS transistor Qn31 is kept constant while the gate voltage becomes high, and thus Vgs≧$V_T$, the capacitance Co associated with the node Ni is the sum of various capacitances illustrated in the structure of FIG. 27. When Vgs≧$V_T$, the transistor Qn31 is associated with a capacitance Cg between the gate electrode 43 and an inversion layer 44, in addition to the capacitance Cj and Cl. Further, a junction capacitance Ci is present between the inversion layer 44 and the substrate 41. As the result of formation of the inversion layer 44, the capacitance 2Cm in FIG. 26 is changed to the capacitance Cg and Ci. In this case, the capacitance Co is given by the following equation $$Co = 2Cj + Cl + Cg + Ci + Cs \qquad \ldots (6)$$

With the notation of L for the length of the gate electrode 43, the capacitance Cg is generally $$Cg = \epsilon_{ox} \frac{L \cdot W}{t_{ox}} \qquad (7)$$

Thus, the capacitance Co associated with the node Ni changes depending on the gate-source voltage Vgs, as illustrated in FIG. 28. The Vgs is a function of the voltage $V_N$ at the node Ni. Accordingly, the equations (4) and (6) changes with respect to the voltage $V_N$, as shown in FIG. 29. In order to obtain the characteristic shown in FIG. 29, the voltage Vo, which may irreversibly be changed between high and low levels and produced from the voltage generator as shown in FIG. 1 or 2, is applied to the gate the MOS transistor Qn31. When the capacitance at the node Ni changes with the voltage $V_N$, it is very difficult to define the capacitance. To avoid this, the average capacitance $\overline{Co}$ with respect to the voltage $V_N$ when the voltage $V_N$ changes between the power supply voltages $V_{DD}$ and $V_{SS}$ is assumed to be the capacitance at the node Ni. The average capacitance $\overline{Co}$ is defined by $$\overline{Co} = \frac{1}{V_{DD} - V_{SS}} \int_{V_{SS}}^{V_{DD}} Co(V_N) dV_N$$

As described above, the irreversible output voltage Vo is applied from the voltage generator to the gate of the MOS transistor Qn31. Accordingly, the capacitance $\overline{Co}$ may be obtained corresponding to the voltage Vo. When Vo=$V_L$ (=$V_{SS}$), the capacitance $\overline{Co}$ is $$\overline{Co}(Vo = V_L) = \frac{1}{V_{DD} - V_{SS}} \int_{V_{SS}}^{V_{DD}} Co(V_N) dV_N \qquad (9)$$

$$= 2\overline{Cj} + Cl + 2Cm + Cs$$

In the above equation, $$\overline{Cj} = \frac{1}{V_{DD} - V_{SS}} \int_{V_{SS}}^{V_{DD}} Cj(V_N) dV_N.$$

When Vo=$V_H$, $$\overline{Co}(Vo = V_H) = \frac{1}{V_{DD} - V_{SS}} \int_{V_{SS}}^{V_{DD}} Co(V) dV = \qquad (10)$$

$$2\overline{Cj} + Cl + \frac{1}{V_{DD} - V_{SS}} \left\{ \int_{V_{SS}}^{V_{DD} - V_T} Cg dV_N + \int_{V_H - V_T}^{V_{DD}} 2Cm dV_N \right\} + \overline{Cj} + Cs = 2\overline{Cj} +$$

$$Cl + \frac{1}{V_{DD} - V_{SS}} \{(V_H - V_{SS} - V_T)Cg + (V_{DD} - V_H + V_T)2Cm\} + \overline{Cj} + Cs$$

In the above equation, $$\overline{Cj} = \frac{1}{V_{DD} - V_T - V_{SS}} \int_{V_{SS}}^{V_{DD} - V_T} Cj(V_N) dV_N$$

In FIG. 29, each value of the average capacitance $\overline{Co}$ when $Vo=V_H$ or $Vo=V_L$ is indicated by a one dot chain line. As seen from FIG. 29, the capacitance Co at the circuit node Ni greatly changes when the output voltage Vo is changed.

Figure 30A:
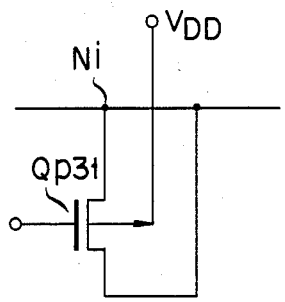
FIGS. 30A to 30C are circuit diagrams of other variable capacitor circuits composed of MOS transistors, respectively.
Figure 30B:
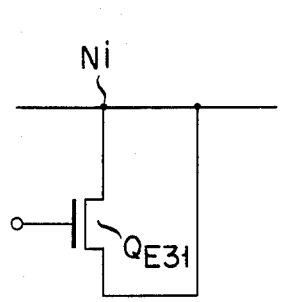
Figure 30C:
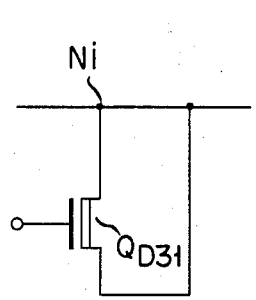
Figure 31:
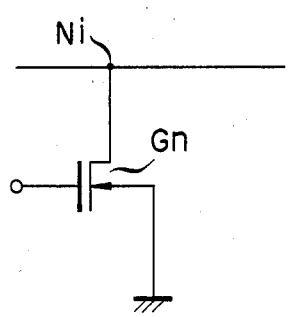
FIG. 31 is a circuit diagram of another variable capacitor circuit composed of a MOS capacitor.
Figure 32A:
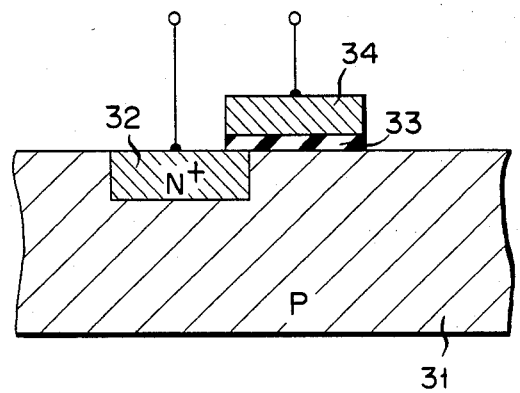
FIGS. 32A and 32B show a cross sectional view and a plan view of the variable capacitor circuit shown in FIG. 31.
Figure 32B:
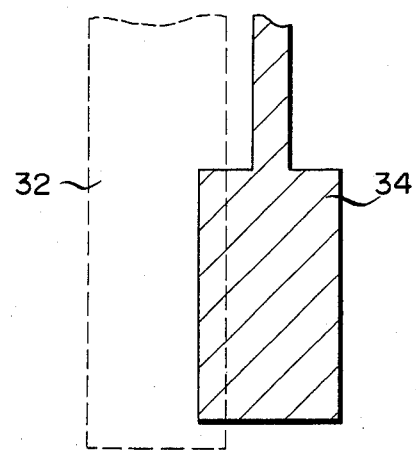

The N-channel enhancement MOS transistor Qn31 shown in FIG. 25 may be replaced by a P-channel enhancement type MOS transistor Qp31, as shown in FIG. 30A. The transistor Qp31 is connected at the drain and source to the node Ni. Another modification of the FIG. 25 example is shown in FIG. 30B in which an enhancement type MOS transistor $Q_{E31}$ is used and its drain and source are connected to the circuit node Ni. Further, as shown in FIG. 30C, a depletion type MOS transistor $Q_{D31}$ may be used with its drain and source both connected to the circuit node Ni. In the circuit shown in FIGS. 30A to 30C, by turning on and off the MOS transistors, the capacitance Co at the circuit node Ni may be changed, as in the circuit shown in FIG. 25. For changing the effective capacitance Co at the node Ni, a MOS capacitor Gn may be used in place of the transistor in each of the circuits shown in FIGS. 25 and 30A to 30C. The FIG. 31 circuit has the MOS capacitor Gn of the N conductivity enhancement type connected at one end to a circuit node Ni. A cross sectional view and a plan view of the MOS capacitor Gn are illustrated in FIGS. 32A and 32B, respectively. As shown, an N+ region 32 is formed in the surface region by an impurity diffusion process, for example. A gate insulation film 33 made of SiO2, for example, is formed on the P type semiconductor substrate 31, while covering a portion of the PN junction formed between the substrate 31 and the region 32. A gate electrode made of polysilicon, for example, is further laid over the film 33.

The N+ region 32 is connected to the circuit node Ni. A P well region formed in the N type semiconductor substrate may be substituted for the P type semiconductor substrate 31.

Figure 33:
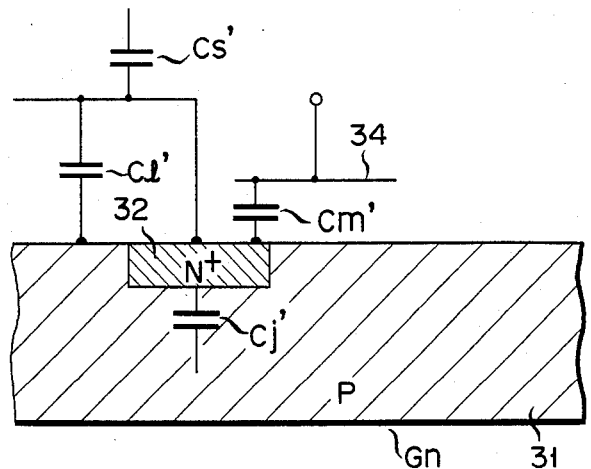
FIGS. 33 and 34 respectively show cross sectional views of the variable capacitor circuit shown in FIG. 31 in which equivalent circuits for different operation modes are depicted.

There is a voltage applied between the gate electrode of the MOS capacitor Gn and the node Ni. An inversion voltage Vinv is used for forming an inversion layer on the surface portion of the substrate 31, which is under the gate electrode 34. Of these voltages, when the voltage difference of the gate of the MOS capacitor to the node Ni is smaller than the inversion voltage Vinv, a capacitance C′o at the node Ni is the sum of various capacitors in the MOS capacitor Gn shown in FIG. 33 illustrating its cross section. Under that condition, a junction capacitance C′j is provided between the N+ region 32 and the substrate 31. C′l is associated with an interconnection wire connecting the N+ region 32 with the circuit node Ni. A capacitance C′m is parasitic to the lateral overlapping portion of the N+ region 32 with the gate electrode 34. Further, a capacitance C′s is a stray one to the gate. Accordingly, the capacitance C′o of the gate is given by $$C'o = C'j + C'l + C'm + C's \quad \ldots (11)$$

If the area of the overlapping portion of the N+ region 32 with the electrode 34 is $\Delta S$, the capacitance C′m is given by $$C'm = \epsilon_{ox} \frac{\Delta S}{t_{ox}} \quad (12)$$

Figure 34:
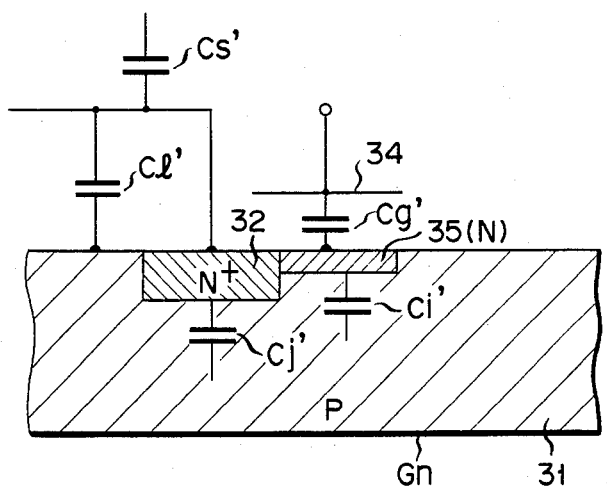

When the voltage applied to the gate electrode of the MOS capacitor Gn with respect to the node Ni is larger than the inversion voltage Vinv, the capacitance C′o at the node Ni is the sum of the various capacitances in the MOS capacitor Gn as illustrated in FIG. 34. The MOS capacitor Gn contains may various types of capacitances; the capacitances C′j, C′l and C′s are previously defined and a capacitance C′g presents between the gate electrode 34 and the inversion layer 35, and a capacitance C′i between the inversion layer 35 and the substrate 31. Like the MOS transistor, as the result of formation of the inversion layer 35, the capacitance C′m disappears and the capacitances C′g and C′i appear. Accordingly, the capacitance C′o in this case is expressed as $$C'o = C'j + C'l + C'g + C'i + C's \ldots \quad (13)$$

If the gate area of the MOS capacitor Gn is S, the capacitance C′g is quantitatively $$C'g = \epsilon_{ox} \frac{S}{t_{ox}} \quad (14)$$

Figure 35:
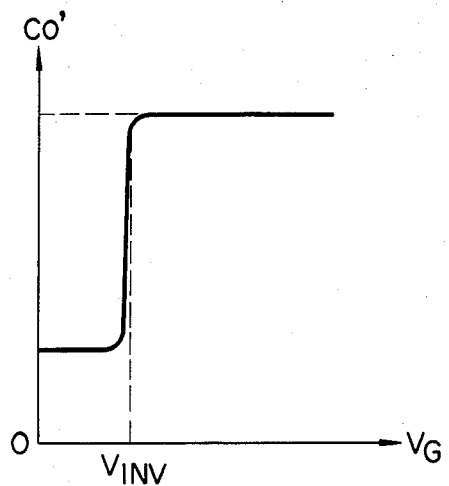
FIG. 35 shows a graph illustrating a variation in capacitance of a variable capacitor with respect to a gate-substrate voltage of the variable capacitor circuit shown in FIG. 31.
Figure 36:
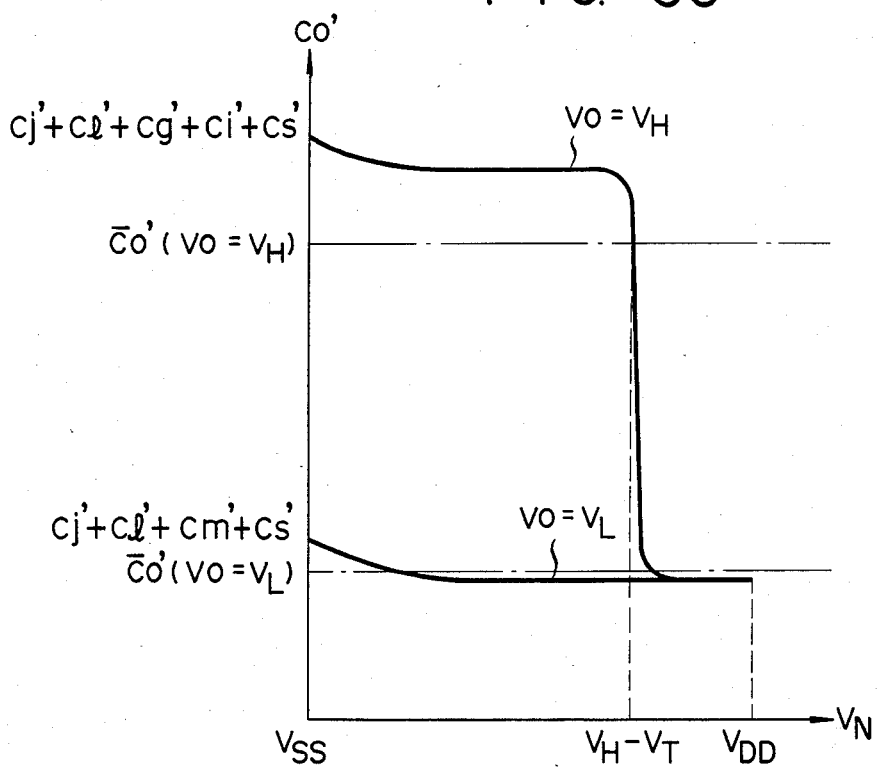
FIG. 36 shows a graphical representation of a variation of capacitance of a variable capacitor with respect to a node voltage $V_N$ of the variable capacitor circuit shown in FIG. 31.

As described above, the capacitance C′o associated with the node Ni is determined by the gate voltage Vg applied to between the MOS capacitor Gn and the node Ni, and its relation is illustrated in FIG. 35. Similar to the capacitor by MOS transistors, this capacitor is related to the voltage $V_N$ at the node Ni. The relation to the voltage $V_N$ is illustrated in FIG. 36, which is equivalent to the characteristic curve of FIG. 29. In FIG. 36, the each level as indicated by a one dot chain line indicates an average capacitance of the capacitor $\overline{C'o}$. Also in this circuit using the MOS capacitor Gn, the capacitance at the node Ni is changed by changing the irreversibly changeable voltage Vo output from the voltage generator, as in the previous cases described referring to FIGS. 25 and 30A to 30C.

Figure 37:
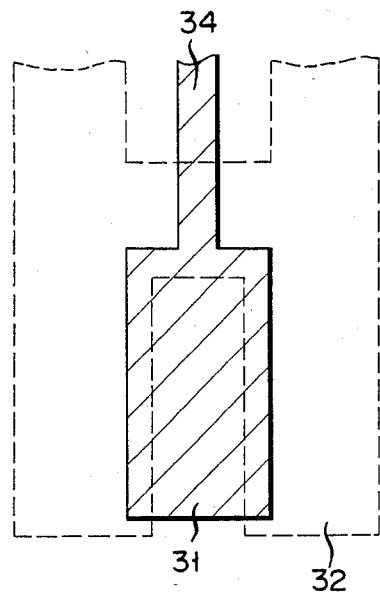
FIG. 37 shows a plan view of an example of the variable capacitor circuit shown in FIG. 31.
Figure 38:
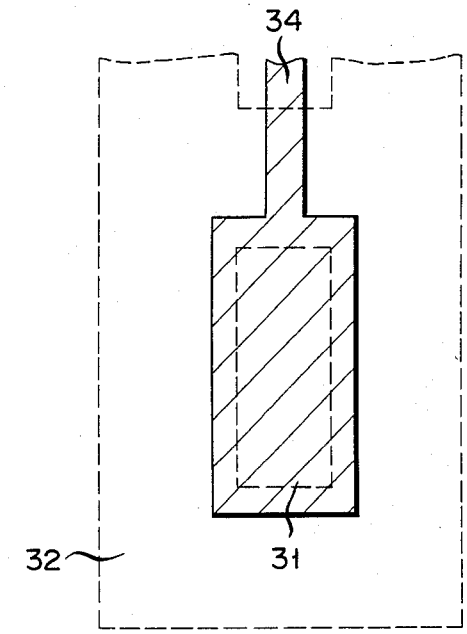
FIG. 38 shows a plan view of another example of the variable capacitor circuit shown in FIG. 31.

The MOS capacitor Gn of which the pattern is illustrated in FIG. 32B may be substituted by MOS capacitor Gn with the patterns as shown in FIGS. 37 or 38. In both the FIGS. 36 and 37, for example, the gate electrodes 34 partially covers a PN junction formed between the substrate 31 and the N region 32.

Figure 39A:
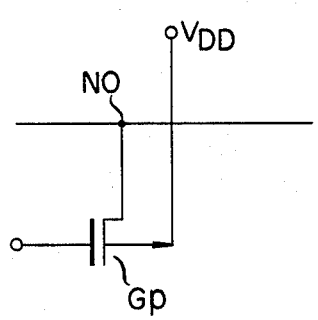
FIGS. 39A to 39C are circuit diagrams of other examples of the variable capacitor circuit composed of a MOS capacitor.
Figure 39B:
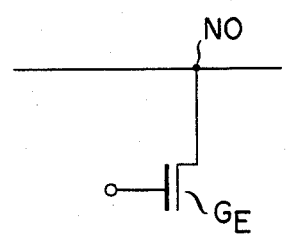
Figure 39C:
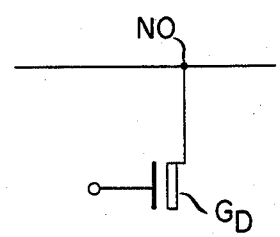

While in the above example one end of the MOS capacitor Gn of the N conductivity enhancement type is connected to the circuit node Ni, one end of P conductivity enhancement type MOS capacitor Gp may be connected to the node Ni as shown in FIG. 39A. Further, one end of an enhancement type MOS capacitor $G_E$ shown in FIG. 39B and one end of a depletion type MOS capacitor $G_D$ in FIG. 39C may be connected to the node.

Turning to FIG. 40, there is shown a circuit arrangement when the variable capacitor shown in FIG. 25 is applied for the C-MOS inverter. As shown, a series circuit including P- an N-channel MOS transistors Qp11 and Qn11 is inserted between power supply voltages $V_{DD}$ and $V_{SS}$, thereby forming a C-MOS inverter $I_1$. The gates of both the transistors are connected to each other and its conjunction node serves as an input terminal applied with an input voltage Vin. The drains of both the transistors Qp11 and Qn11 are interconnected and its conjunction node serves as an output node N1. The drain and source of an N-channel MOS transistor Qn31 are both connected to the output node N1. The gate of the transistor Qn31 is impressed with the output voltage Vo from the voltage generator shown in FIG. 1 or 2. The voltage at node N1 is controlled by the MOS transistors Qn11 and Qp11.

In the circuit, a rise time $t_r$ and a fall time $t_f$ of the output voltage Vout is given by $$t_r \cong \frac{a \cdot \overline{C}(Vo)}{\beta p} \quad (15)$$

$$t_f \cong \frac{a \cdot \overline{C}(Vo)}{\beta n}, \quad (16)$$

where $\overline{C}(Vo)$ is an average value of the effective capacitance at the node N1, and $\beta p$ and $\beta n$ are $\beta$ of the transistors Qp11 and Qn11, and "a" is a proportional constant. As seen from the equations (15) and (16), the rise and fall times $t_r$ and $t_f$ are both adjustable by changing the average capacitance $\overline{C}(Vo)$ which can be changed by the output voltage Vo.

FIG. 41 shows output characteristic curves of the rising and falling of the output voltage Vout when $Vo=V_H$ and $Vo=V_L$.

FIG. 42 is a circuit diagram when an enhancement type MOS transistor as a variable capacitor element is applied for an E/D inverter. The drain of a depletion type MOS transistor $Q_{D11}$ is connected to the power supply voltage $V_{DD}$, and the source and gate thereof are connected to a node N2. The drain of an enhancement type MOS transistor $Q_{E11}$ is connected to the node N2 and its source is connected to the power supply voltage $V_{SS}$. Such a connection of the transistor forms an E/D inverter I2. An input voltage Vin is applied for the gate of the MOS transistor $Q_{E11}$. The node N2 is connected to the drain and source of an enhancement type MOS transistor $Q_{E31}$. The gate of the transistor $Q_{E31}$ is applied with the voltage Vo. Also in this circuit, the rise and fall times $t_r$ and $t_f$ are adjustable by changing the voltage Vo from the voltage generator.

FIG. 43 shows another circuit when an enhancement type MOS transistor $Q_{E31}$ as a variable capacitor element is applied to an E/E inverter. As shown, the drain and gate of an enhancement type MOS transistor $Q_{E20}$ are connected to the power supply voltage $V_{DD}$ and its source to the node N3. The drain of another enhancement type MOS transistor $Q_{E21}$ is connected to a node N2 and its source to the power supply voltage $V_{SS}$. With this connection, an E/E inverter I3 is formed. An input voltage Vin is applied to the gate of the MOS transistor $Q_{E21}$. The drain and source of the MOS transistor $Q_{E31}$ are connected to the node N3. The gate of the transistor $Q_{E31}$ is impressed with the output voltage Vo from the voltage generator as shown in FIG. 1 or 2. The MOS transistors $Q_{E20}$, $Q_{E21}$ and $Q_{E31}$ are all of the N-channel type. This circuit may also adjust the rise and fall times $t_r$ and $t_f$ of the output voltage by changing the output voltage Vo, like the FIGS. 40 and 42 circuits.

Figure 44:
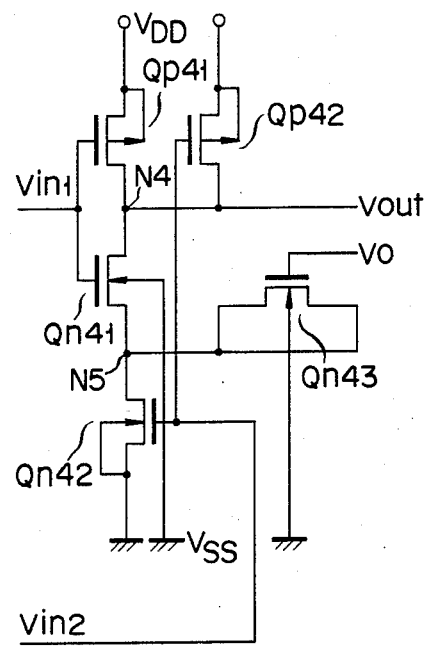

FIG. 44 shows a circuit arrangement when a variable capacitor element composed of a MOS transistor is applied to a C-MOS NAND gate circuit. A couple of P-channel MOS transistors Qp41 and Qp42 are inserted in parallel between the power supply voltage $V_{DD}$ and an output node N4. A couple of N-channel MOS transistors Qn41 and Qn42 are connected in series between an output node N4 and the power supply voltage $V_{SS}$, thereby forming a C-MOS NAND gate circuit with two inputs. The gates of these transistors Qp41 and Qn41 are interconnected and the conjunction node serves as an input terminal of the two, which is applied with an input voltage Vin1. The gates of the transistors Qp42 and Qn42 are also interconnected and the conjunction node to the input terminal applied with the other input voltage Vin2. The drain and the source of an N-channel MOS transistor Qn43 are commonly connected to the node N5 as the series conjunction of the MOS transistors Qn41 and Qn42. The gate of the transistor Qn43 is applied with the output voltage Vo from the voltage generator shown in FIG. 1 or 2.

In this circuit, when $Vo=V_H$, the effective capacitance at a node N5 increases. A rise time of the output voltage when the input voltage Vin is high voltage and Vin2 is low voltage is longer than that when the input voltage Vin1 is low voltage and Vin2 is high voltage.

Figure 45:
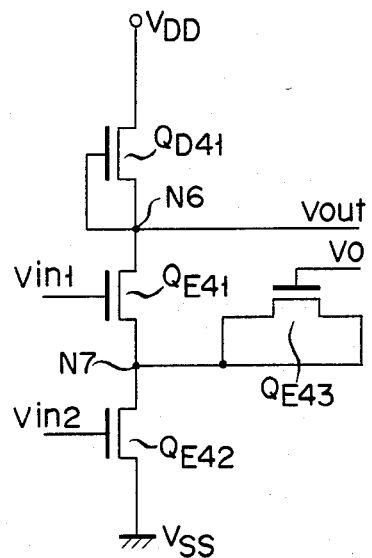

FIG. 45 shows a circuit arrangement when a variable capacitor element composed of a MOS transistor is applied to an E/D NAND gate circuit. A depletion type MOS transistor $Q_{D41}$ is inserted between the power supply voltage $V_{DD}$ and an output node N6. Two enhancement type MOS transistors $Q_{E41}$ and $Q_{E42}$ are inserted in series between the output node N6 and the power supply voltage $V_{SS}$. With this connection, an E/D NAND gate circuit with two inputs is formed. The gate of the transistor $Q_{E41}$ serves as a first input terminal applied with an input voltage Vin1. The gate of the MOS transistor $Q_{E42}$ serves as a second input terminal applied with an input voltage Vin2. An enhancement type MOS transistor $Q_{E43}$ is connected at its drain and source to a node N7 as a series conjunction of the transistors $Q_{E41}$ and $Q_{E43}$. The output voltage Vo from the voltage generator as shown in FIG. 1 or 2 is applied to the gate of the MOS transistor $Q_{E43}$.

Also in this circuit arangement, when $Vo=V_H$, the capacitance at node N7 increases. A rise time of the output voltage Vin1 when the input voltage Vin1 is high voltage and Vin2 is low voltage is longer than that when the input voltage Vin1 is low voltage and Vin2 is high voltage.

Figure 46:
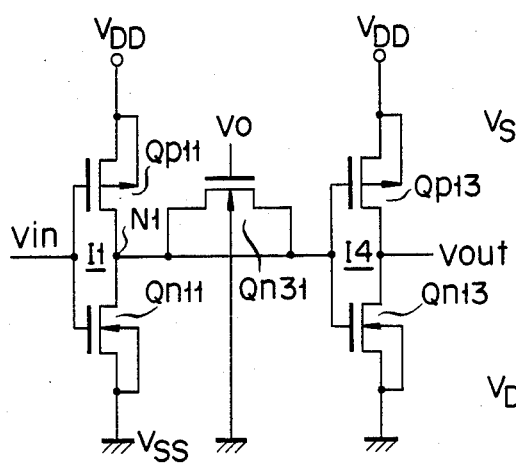

A circuit arrangement shown in FIG. 46 is a C-MOS delay circuit. The delay circuit includes a MOS transistor for the variable capacitance, of which the drain and source are connected together to an output node N1 of the C-MOS inverter $I_1$ composed of P- and N-channel MOS transistors Qp11 and Qn11. The node N1 is further connected to an input terminal of a succeeding stage of an inverter I4 composed of P- and N-channel MOS transistors Qp13 and Qn13.

Figure 47A:
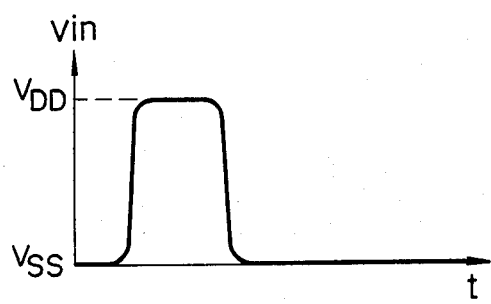
FIGS. 47A and 47B respectively show input and output characteristics of the integrated circuit shown in FIG. 46.
Figure 47B:
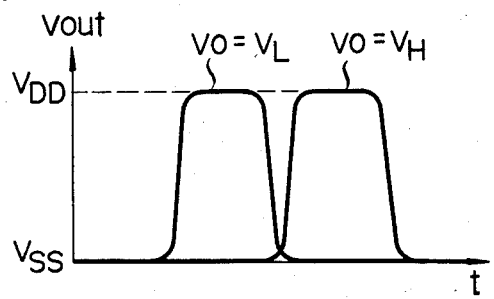

In this circuit, when $Vo=V_H$, the MOS transistor Qn31 is turned on to increase the capacitance at node N1. As seen from FIGS. 47A and 47B, a delay time of the output voltage Vout (FIG. 47B) to the input voltage Vin (FIG. 47A) for $Vo=V_H$ is larger than that for $Vo=V_L$.

Figure 48:
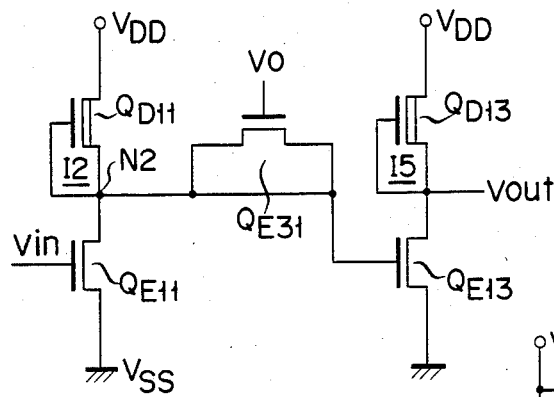
FIGS. 48 to 51 are circuit diagrams of other embodiments of the integrated circuit incorporating a variable capacitor circuit composed of a MOS transistor.

An E/D delay circuit is illustrated in FIG. 48. The delay circuit, like the FIG. 46 delay circuit, has a MOS transistor $Q_{E31}$ for the variable capacitance, of which the drain and the source are connected to an output node N2 of an E/D inverter I2 composed of an enhancement type MOS transistor $Q_{E11}$ and a depletion type MOS transistor $Q_{D11}$. The node N2 is further connected to an input terminal of a succeeding stage of an E/D inverter I5 composed of a depletion type MOS transistor $Q_{D13}$ and an enhancement type MOS transistor $Q_{E13}$. In this circuit, when $Vo=V_H$, the MOS transistor $Q_{E31}$ is ON to increase the capacitance at the node N2. Through this operation, a delay time of the output voltage Vout when $Vo=V_H$ is larger than that when $Vo=V_L$.

The FIGS. 40 to 48 circuits each employ one MOS transistor of which the drain and source are connected to the output node, and the gate is coupled with the voltage Vo. The single MOS transistor may be substituted for two or more transistors. Such examples will be given referring to FIGS. 49 to 51.

Figure 49:
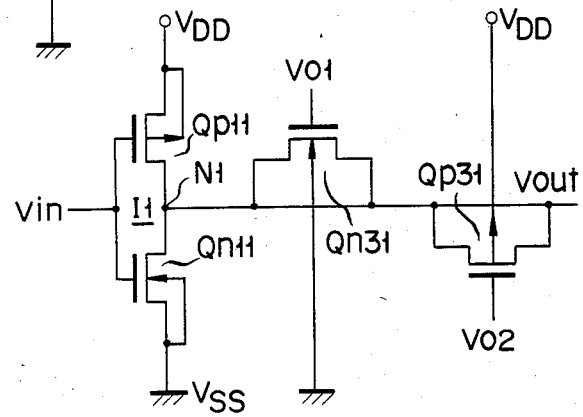

In the circuit shown in FIG. 49, the drain and source of an N-channel MOS transistor Qn31 are connected to an output node Nl of a C-MOS inverter $I_1$, and further the drain and source of a P-channel MOS transistor Qp31 are connected to the node Nl. The gate of the MOS transistor Qn31 is impressed with a voltage Vo1 and the gate of the MOS transistor Qp31 with a voltage $\overline{Vo2}$ different from the Vo1.

Figure 50:
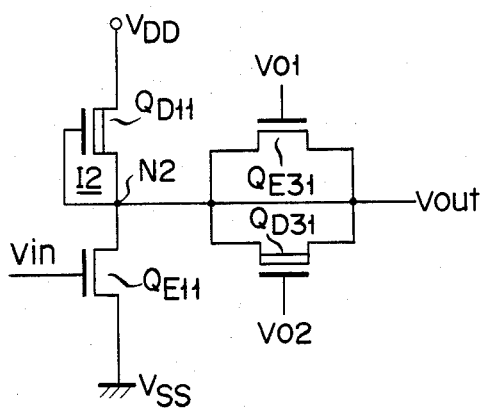

In the circuit of FIG. 50, the drain and source of the MOS transistor $Q_{E31}$ of the enhancement type are connected to an output node N2 of an E/D inverter I2, and further the drain and source of a depletion type MOS transistor $Q_{D31}$ to the node N2. A voltage Vo1 is applied to the gate of the transistor $Q_{E31}$ and another voltage Vo2 to the gate of the transistor $Q_{D31}$.

Figure 51:
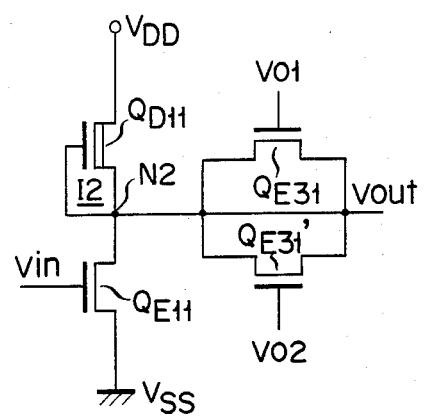

In the circuit of FIG. 51, the drain and source of an enhancement type MOS transistor $Q_{E31}$ are connected to the output node N2 of an E/D inverter I2, and respectively connected to the drain and source of another enhancement type MOS transistor $Q_{E31}'$ of which the threshold voltage is different from that of the transistor $Q_{E31}$. The output voltages Vo1 and Vo2 derived from different voltage generators are applied to the gates of the transistors $Q_{E31}$ and $Q_{E31}'$.

A circuit arrangement shown in FIG. 52 employs an N conductivity MOS capacitor Gn1 in place of the MOS transistor Qn31 in FIG. 40. Also in this circuit, a rise time and a fall time of the output voltage Vout may be made to differ between $Vo=V_L$ and $Vo=V_H$ by changing the voltage Vo applied to the gate of the MOS capacitor Gn1, as shown in FIG. 53.

A circuit arrangement of FIG. 54 uses an enhancement type MOS capacitor $G_{E1}$ in place of the MOS transistor $Q_{E31}$ of FIG. 42, and connects it to the node N2.

A circuit arrangement of FIG. 55 uses an enhancement type MOS capacitor $G_{E2}$ in place of the MOS transistor $Q_{E31}$ in FIG. 43, and connects it to the node N3.

Figure 56:
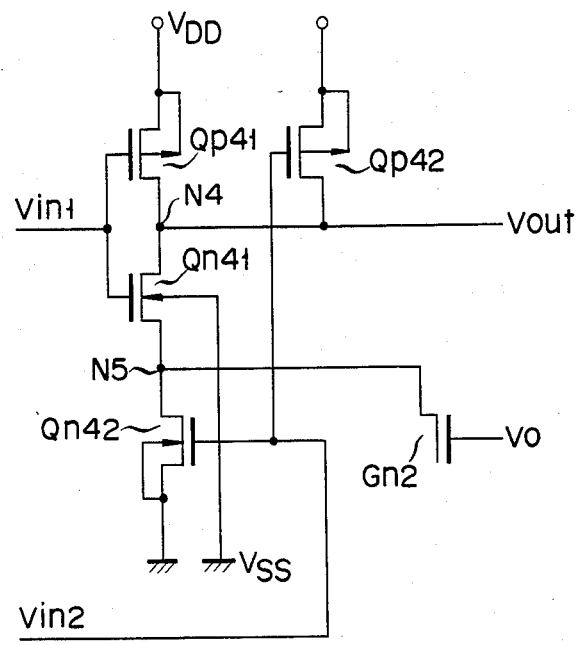

A circuit arrangement of FIG. 56 uses an N conductivity MOS capacitor Gn2 in place of the MOS transistor Qn43 in FIG. 44 and connects it to the node N5.

Figure 57:
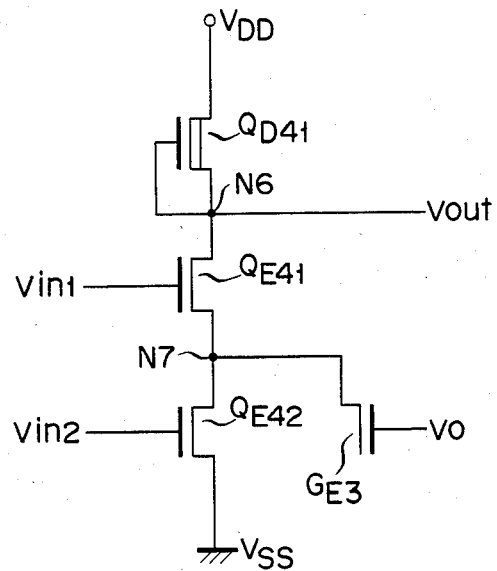

FIG. 57 shows another circuit arrangement using an enhancement type MOS capacitor $G_{E3}$ connected to the node N7, in place of the MOS transistor $Q_{E43}$.

The circuit arrangements shown in FIGS. 54 to 57 may change electrical characteristics by changing the voltage applied to the gates of the MOS capacitors, like the circuit arrangements of FIGS. 42 to 45. Thus, the rise time and/or fall time of the output voltage may be made to differ between $Vo=V_L$ and $Vo=V_H$.

Figure 58:
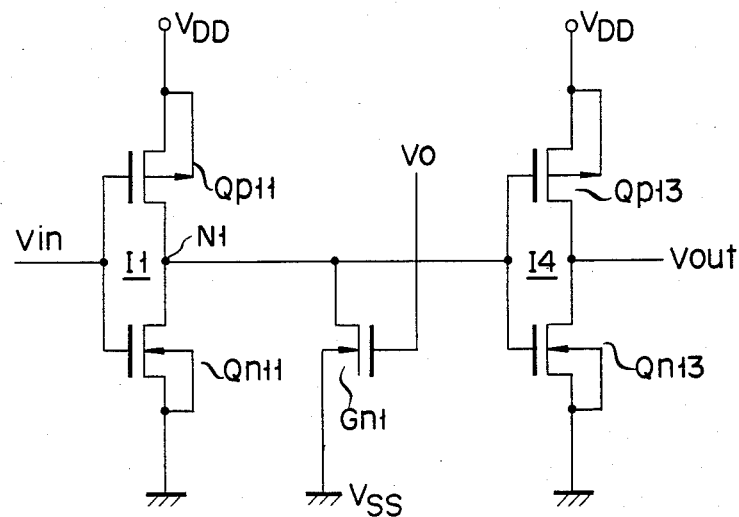
Figure 59A:
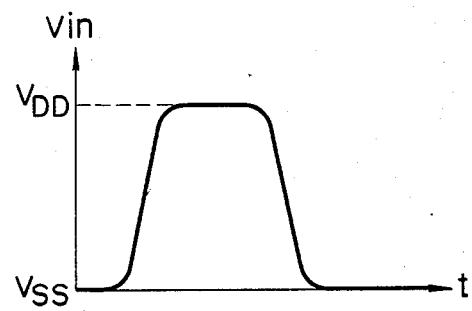
FIGS. 59A and 59B respectively show input and output characteristics of the integrated circuit shown in FIG. 58.
Figure 59B:
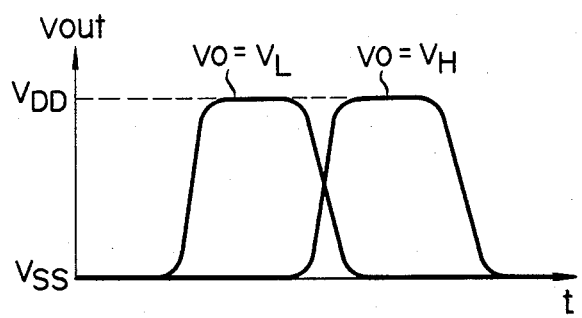

In a FIG. 58 circuit arrangement as a delay circuit, the MOS transistor Qn31 in FIG. 46 is substituted by an N conductivity MOS capacitor Gn1 connected to an output node Nl of the C-MOS inverter $I_1$. Also in this case, by changing the voltage Vo applied to the gate of the MOS capacitor Gn1, a delay time of the output voltage Vout to the input voltage Vin is made to differ between $Vo=V_L$ and $Vo=V_H$, as shown in FIGS. 59A and 59B.

A circuit arrangement of FIG. 60 employs an enhancement type MOS capacitor $G_{E1}$ connected to the node N2, in place of the MOS transistor $Q_{E31}$ in FIG. 48.

A FIG. 61 circuit uses P- and N-channel MOS capacitors Gp1 and Gn1 connected to the output node Nl, in place of the two transistors Qp31 and Qn31 in FIG. 49.

A FIG. 62 circuit arrangement is equivalent to the FIG. 50 circuit arrangement when the two MOS transistors $Q_{D31}$ and $Q_{E31}$ are substituted by a depletion type MOS capacitor $G_{D1}$ and an enhancement type MOS capacitor $G_{E1}$ connected to the node N2, respectively.

A FIG. 63 circuit arrangement corresponds to the FIG. 51 circuit arrangement when enhancement type MOS capacitors $G_{E1}$ and $G_{E4}$ with different output voltages Vo1 and Vo2 are connected to the output node N2, in lieu of the two MOS transistors $Q_{E31}$ and $Q_{E31}'$.

The FIGS. 60 to 63 circuits may change their electrical characteristics by changing the voltages Vo, Vo1, Vo2 and $\overline{Vo2}$ like the FIGS. 48 to 51 circuits. Accordingly, the rise time and/or fall time of the output voltage Vout may be changed between $Vo=V_H$ and $Vo=V_L$.

While in the embodiments as mentioned above, the variable capacitor circuit is applied to the output node of the logic circuits such as C-MOS inverters, E/D inverters and E/E inverters, it may of course be coupled with the output node of logic circuits such as NOR gate, NAND gate and other logic circuits.

Figure 64:
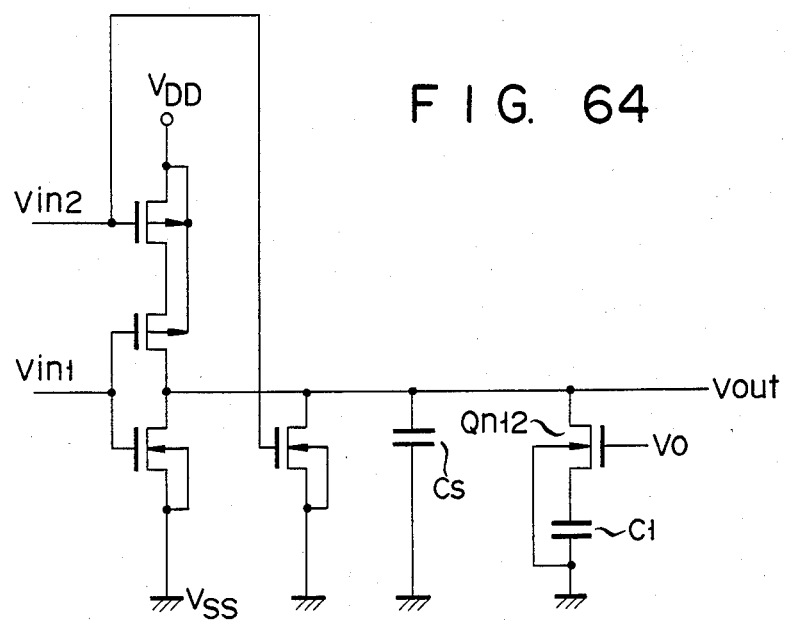

In the FIG. 64 circuit, the variable capacitor circuit comprising a MOS transistor and a capacitor as in the FIG. 3 circuit is applied to a C-MOS type NOR gate having two inputs.

Figure 65:
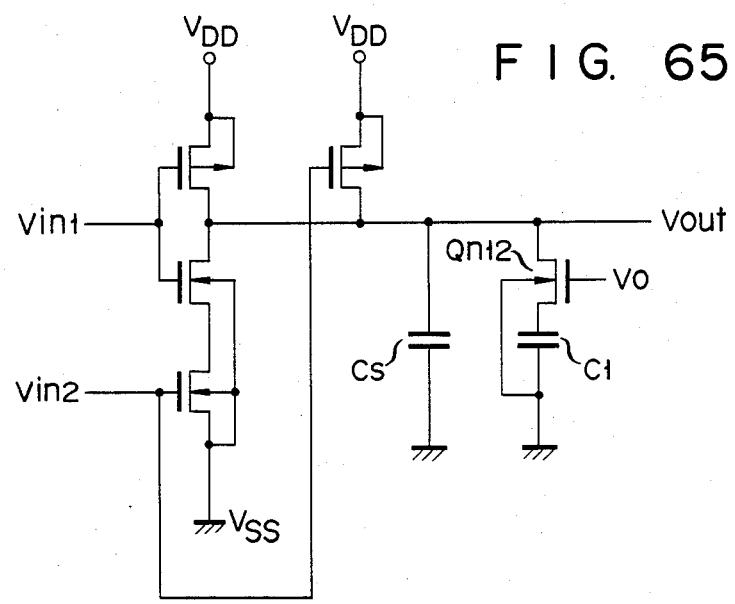

In the FIG. 65 circuit, the variable capacitor circuit comprising a MOS transistor and a capacitor as in the FIG. 3 circuit is applied to a C-MOS type NAND gate having two inputs.

In FIG. 66, the variable capacitor circuit comprising a MOS capacitor and a capacitor as in the FIG. 16 circuit is applied to an E/D type NOR gate having two inputs.

FIG. 67 shows an E/D type NAND gate having two inputs to which the variable capacitor circuit comprising a MOS capacitor and a capacitor as in the FIG. 16 circuit is applied.

Figure 68:
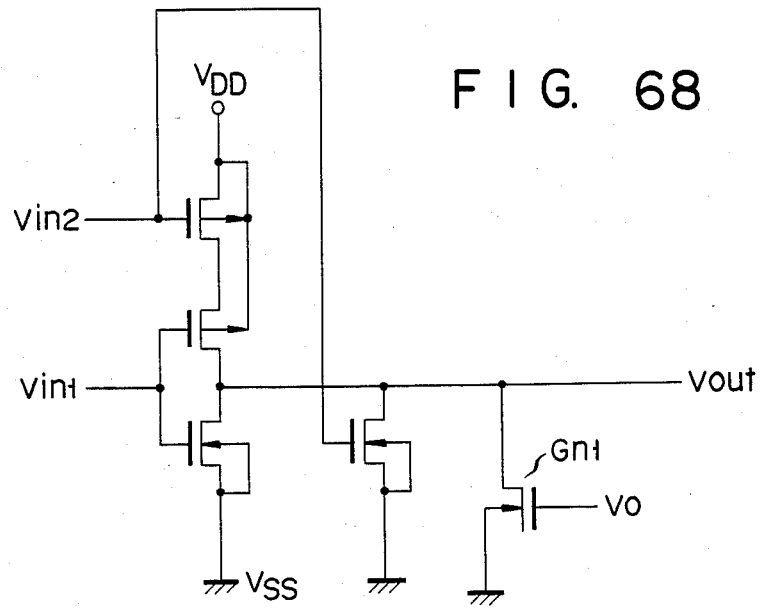

FIG. 68 shows a C-MOS type NOR gate having two inputs to which the variable capacitor circuit comprising an N conductivity type MOS capacitor as in the FIG. 52 circuit is applied.

Figure 69:
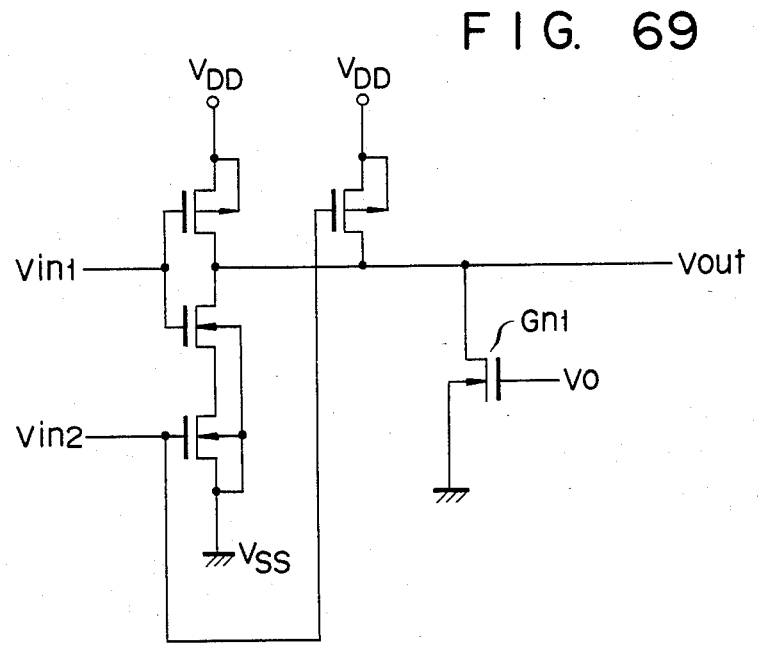

FIG. 69 shows a C-MOS type NAND gate having two inputs to which the variable capacitor circuit comprising an N conductivity type MOS capacitor as in the FIG. 52 circuit is applied.

Figure 70:
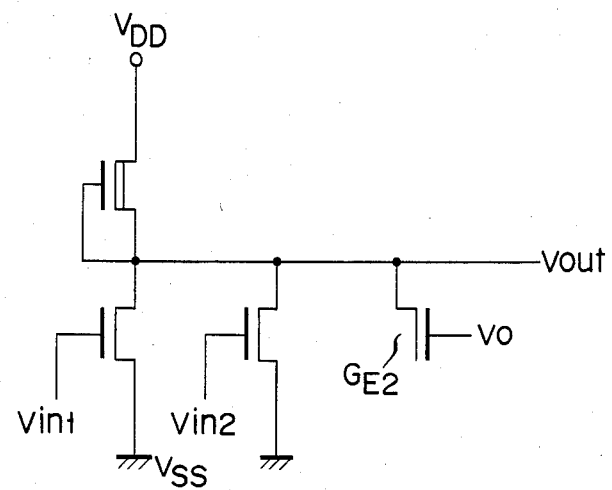

In FIG. 70, the variable capacitor circuit comprising an enhancement type MOS capacitor as in the FIG. 54 circuit is applied to an E/D type NOR gate having two inputs.

Figure 71:
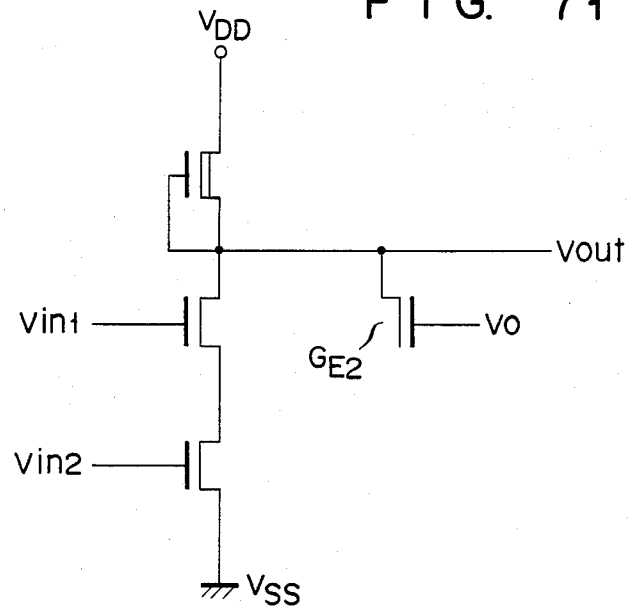

FIG. 71 shows an E/D type NAND gate having two inputs to which the variable capacitor circuit comprising an enhancement type MOS capcitor as in the FIG. 54 circuit is applied.

As seen from the foregoing, the effective capacitance at the node may be changed by changing the voltages Vo, Vo1, Vo2 and $\overline{Vo2}$ applied from the voltage generator to the variable capacitor circuit. In practical use, when manufactured semiconductor circuits exhibit unsatisfactory electrical characteristics, all one has to do is to melt the fuse element of the voltage generator to change the output voltage (Vo, Vo1, Vo2, $\overline{Vo2}$). When this is done, the effective capacitance of the variable capacitor circuit composed of the MOS transistor or MOS capacitor is changed to obtain the satisfactory electrical characteristic. Thus, the present invention has successfully realized MOS type semiconductor integrated circuits with little margin needed for the normal circuit operation time and with a flexible electrical characteristic. Therefore, the excessive margin for the normal circuit operation resulting in the slow operation speed can be excluded in the present invention. The semiconductor integrated circuit is provided with two or more selections for irreversibly providing an optimum circuit operation.

While the above-mentioned embodiments have been described with omitting the voltage generators, it will be understood to those skilled in the art that the voltage generator as shown in FIG. 1 or 2 is coupled with the integrated circuit including the variable capacitor circuit, allowing for its circuit impedance to be changed so as to provide a proper output voltage Vo to the latter.

While in the embodiments as mentioned above, the variable capacitor element is applied to the output node of the logic circuits such as inverters, NOR gates and NAND gates, it may of course be coupled with the output node of other logic circuits. Essentially, the circuit for which the variable capacitor circuit according to the present invention is applicable is any MOS transistor circuit if it contains the node interconnecting the drains and sources of two or more MOS transistors. Further, the voltage generator is not limited to those embodiments shown in FIG. 1 or 2. If the power supply voltage $V_{DD}$ of the voltage generator is set such that the high voltage output $V_H$ of the voltage generator is higher by the threshold voltage $V_T$ than the power supply voltage $V_{DD}$ for the inverter, the NAND gate circuit or the NOR gate circuit, the effective capacitance may unequivocally be defined irrespective of the potential at a node. Additionally, the P- and N-channel MOS transistors may be interchanged in the circuit arrangements as mentioned above, if the polarity of the power supply voltages are correspondingly interchanged. Further, in the embodiments as mentioned above, the MOS transistors may be replaced by bipolar transistors.

As described above, the semiconductor integrated circuit according to the present invention is provided with a voltage generator of which the output voltage is irreversibly changed. The effective capacitance at the node in the MOS transistor circuit and the electrical characteristic thereof as well is changed by changing the output voltage from the voltage generator. Thus, the present invention provides MOS type semiconductor integrated circuits with a proper operation speed and a flexible electrical characteristic.

It should be understood that the present invention may variously be changed and modified within the scope of the present invention.

What is claimed is:

1. An integrated circuit formed on a semiconductor substrate, comprising:
    a first terminal for receiving a first power supply voltage;
    a second terminal for receiving a second power supply voltage;
    a transistor circuit comprising a plurality of transistors connected in series via their drain-source current paths between said first and second terminals, at least one of the transistors being supplied with an input signal at the gate thereof;
    a variable capacitor circuit connected to an output terminal of said transistor circuit between a node at which two of said transistors are interconnected and a reference voltage; and
    a voltage generator for producing an output voltage signal applied to an input terminal of said variable capacitor circuit for controlling the capacitance thereof, the voltage generator being capable of irreversibly changing the level of the output voltage signal thereby changing the capacitance of said variable capacitor circuit.

2. An integrated circuit according to claim 1 wherein said transistors are of MOS type.

3. An integrated circuit according to claim 1 wherein said variable capacitor comprises a switching circuit applied with the output voltage signal of said voltage generator, and a capacitor circuit whose capacitance is invariable, said switching circuit and said capacitor circuit being connected in series to each other.

4. An integrated circuit according to claim 3 wherein said switching circuit comprises at least one transistor to which said output voltage signal of said voltage generator is applied.

5. An integrated circuit according to claim 4 further including a transistor connected in series to said at least one transistor and applied with another input signal.

6. An integrated circuit according to claim 3 wherein said capacitor circuit whose capacitance is invariable comprises at least one capacitor element whose capacitance is invariable.

7. An integrated circuit according to claim 3 wherein said capacitor circuit whose capacitance is invariable comprises a plurality of capacitor elements whose capacitance is invariable connected in parallel to each other.

8. An integrated circuit according to claim 3 including a further transistor connected between a node at which said switching circuit and said capacitor circuit whose capacitance is invariable are interconnected and one of said first and second terminals.

9. An integrated circuit according to claim 8 wherein said further transistor is applied with said input signal at the gate thereof.

10. An integrated circuit according to claim 8 wherein said transistor is connected at the gate to said node at which said switching circuit and said capacitor circuit whose capacitance is invariable are interconnected.

11. An integrated circuit according to claim 1 wherein said variable capacitor circuit comprises at least one MOS transistor whose drain and source node are connected to said node, whose gate is connected to the output voltage signal of said voltage generator and whose substrate is connected to said reference voltage.

12. An integrated circuit according to claim 11 wherein said reference voltage is one of said first power supply voltage and said second power supply voltage.

13. An integrated circuit according to claim 11 wherein said at least one MOS transistor is of the N-channel type.

14. An integrated circuit according to claim 11 wherein said at least one MOS transistor is of the P-channel type.

15. An integrated circuit according to claim 11 wherein said at least one MOS transistor is of the enhancement type.

16. An integrated circuit according to claim 11 wherein said at least one MOS transistor is of the depletion type.

17. An integrated circuit according to claim 1 wherein said variable capacitor circuit comprises at least one MOS capacitor comprising a semiconductor region formed in said semiconductor substrate and having a conductivity opposite to that of said semiconductor substrate, an insulation film formed on said semiconductor region and semiconductor substrate, and a gate electrode formed on said insulation film, said gate electrode being connected to said output voltage signal and said semiconductor region being connected to said node.

18. An integrated circuit according to claim 17 wherein said reference voltage is one of said first power supply voltage and said second power supply voltage.

19. An integrated circuit according to claim 17 wherein said MOS capacitor is of the N conductivity type.

20. An integrated circuit according to claim 17 wherein said MOS capacitor is of the P conductivity type.

21. An integrated circuit according to claim 17 wherein said MOS capacitor is of the enhancement type.

22. An integrated circuit according to claim 17 wherein said MOS capacitor is of the depletion type.

23. An integrated circuit according to claim 1 further comprising another transistor circuit including a plurality of transistors connected in series between said first and second terminals, said node being connected to at least one of the gates of said transistors of said another transistor circuit.

* * * * *